(12) United States Patent
Park et al.

(10) Patent No.: US 9,761,795 B2
(45) Date of Patent: Sep. 12, 2017

(54) METHOD AND PROCESSING APPARATUS FOR FABRICATING A MAGNETIC RESISTIVE RANDOM ACCESS MEMORY DEVICE

(71) Applicants: Yongsung Park, Suwon-si (KR); Kiwoong Kim, Hwaseong-si (KR); Sangyong Kim, Suwon-si (KR); Sechung Oh, Yongin-si (KR); Youngman Jang, Hwaseong-si (KR)

(72) Inventors: Yongsung Park, Suwon-si (KR); Kiwoong Kim, Hwaseong-si (KR); Sangyong Kim, Suwon-si (KR); Sechung Oh, Yongin-si (KR); Youngman Jang, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/390,699

(22) Filed: Dec. 26, 2016

(65) Prior Publication Data
US 2017/0110657 A1    Apr. 20, 2017

Related U.S. Application Data

(63) Continuation of application No. 14/794,796, filed on Jul. 8, 2015, now Pat. No. 9,570,673.

(30) Foreign Application Priority Data

Nov. 18, 2014   (KR) .................. 10-2014-0161006

(51) Int. Cl.
*H01L 21/00*   (2006.01)
*H01L 43/12*   (2006.01)
*H01L 43/08*   (2006.01)
*H01L 43/02*   (2006.01)
*H01L 43/10*   (2006.01)
*H01L 27/22*   (2006.01)

(52) U.S. Cl.
CPC ............ *H01L 43/12* (2013.01); *H01L 27/224* (2013.01); *H01L 27/228* (2013.01); *H01L 43/02* (2013.01); *H01L 43/08* (2013.01); *H01L 43/10* (2013.01)

(58) Field of Classification Search
CPC ......... H01L 43/08; H01L 43/12; H01L 27/22; H01L 27/228; H01L 27/224
See application file for complete search history.

(56) References Cited

U.S. PATENT DOCUMENTS

| 8,686,484 | B2 | 4/2014 | Whig et al. |
| 8,728,830 | B2 | 5/2014 | Nishimura |
| 2007/0154630 | A1 | 7/2007 | Kim et al. |
| 2008/0246104 | A1 | 10/2008 | Ranjan et al. |

(Continued)

*Primary Examiner* — Zandra Smith
*Assistant Examiner* — John M Parker
(74) *Attorney, Agent, or Firm* — Renaissance IP Law Group LLP

(57) ABSTRACT

Methods of fabricating MRAM devices are provided along with a processing apparatus for fabricating the MRAM devices. The methods may include forming a ferromagnetic layer, cooling the ferromagnetic layer to a temperature within a range of between about 50° K to about 300° K, forming and oxidizing one or more Mg layers on the cooled ferromagnetic layer to form an MgO structure, forming a free layer on the MgO structure, and forming a capping layer on the free layer.

15 Claims, 23 Drawing Sheets

(56) References Cited

U.S. PATENT DOCUMENTS

| | | | |
|---|---|---|---|
| 2008/0273375 A1* | 11/2008 | Dahmani | B82Y 25/00 365/158 |
| 2008/0291720 A1* | 11/2008 | Wang | G11C 11/16 365/173 |
| 2012/0313191 A1 | 12/2012 | Whig et al. | |
| 2013/0216702 A1 | 8/2013 | Kaiser et al. | |
| 2016/0087193 A1 | 3/2016 | Pinarbasi et al. | |

* cited by examiner

METHOD AND PROCESSING APPARATUS FOR FABRICATING A MAGNETIC RESISTIVE RANDOM ACCESS MEMORY DEVICE

CROSS-REFERENCE TO RELATED APPLICATION

This application is a continuation of U.S. patent application Ser. No. 14/794,796, filed on Jul. 8, 2015, which claims priority under 35 U.S.C. §119 to Korean Patent Application No. 10-2014-0161006 filed on Nov. 18, 2014, the disclosure of which is hereby incorporated by reference in its entirety.

BACKGROUND

Field

Embodiments of the inventive concepts disclosed herein relate to magnetic resistive random access memory (MRAM) devices including magneto resistive cells and transistors or diodes, along with a method of fabricating MRAM devices having magneto resistive cells and a processing apparatus for performing the fabrication process.

Description of Related Art

A magnetic resistive random access memory (MRAM) device is suggested as a next-generation memory device for replacing existing dynamic random access memory (DRAM) devices. MRAM devices are promising because of their low power consumption, high-speed operation, and non-volatile characteristics. A magneto resistive cell of an MRAM device can have higher data reliability as tunneling magneto resistance (TMR) is increased, and can operate in a lower power mode as resistance of a tunneling barrier layer is decreased. Accordingly, obtaining a high TMR and a low RA (i.e., resistance×area of the tunneling barrier layer) are very important considerations for MRAM devices.

Currently, magnesium (Mg) used in a source of the tunneling barrier layer is a very highly oxidative material and is therefore very easily over-oxidized. Accordingly, it is desirable to prevent over-oxidation of the magnesium (Mg) to form an oxidized magnesium layer having a magnesium (Mg) to oxygen (O) ratio of 1:1.

SUMMARY

Embodiments of the inventive concepts provide a magnetic resistive random access memory (MRAM) device.

Other embodiments of the inventive concepts provide a method of fabricating the MRAM device.

Other embodiments of the inventive concepts provide an apparatus for fabricating MRAM devices.

Other embodiments of the inventive concepts provide a magneto resistive cell having a low RA value.

Other embodiments of the inventive concepts provide a method of fabricating a magneto resistive cell having a low RA value.

Other embodiments of the inventive concepts provide an apparatus of fabricating a magneto resistive cell having a low RA value.

Other embodiments of the inventive concepts provide a memory module and electronic system including one or more MRAM devices constructed using the method and/or apparatus disclosed herein.

The technical objectives and embodiments of the present inventive concepts are not limited to those listed above, however, and other objectives and embodiments may be apparent to those of ordinary skill in the art based on the following written description and accompanying drawings.

In accordance with an aspect of the inventive concepts, a method of fabricating a magnetic resistive random access memory (MRAM) device may include forming a lower electrode on a substrate, forming a seed layer on the lower electrode, forming a pinning layer on the seed layer, forming a synthetic anti-ferromagnetic (SAF) layer on the pinning layer, forming a pinned layer on the SAF layer, and then cooling the substrate having the pinned layer exposed thereon to a temperature within a range of approximately between about 50° K to about 300° K. After the substrate has been cooled, the method may further include forming a first Mg layer on the cooled pinned layer, forming a first MgO layer by oxidizing the first Mg layer, forming a second Mg layer on the first MgO layer, forming a second MgO layer by oxidizing the second Mg layer, forming a free layer on the second MgO layer, forming a capping layer on the free layer, and forming an upper electrode on the capping layer. One or more additional MgO or other layers may be formed on the second MgO layer before forming the free layer on the MgO multilayer structure. The MgO layers may further be unified to form a single contiguous layer.

In accordance with another aspect of the inventive concepts, a method of fabricating an MRAM device may include forming a lower electrode on a substrate, forming a seed layer having Ta and Ru on a lower electrode, forming a pinning layer having Co on the seed layer, forming an SAF layer having Ru on the pinning layer, forming a pinned layer having CoFe on the SAF layer, and then cooling the substrate having the pinned layer exposed thereon to a temperature within a range of approximately between about 50° K to about 300° K. After the substrate has been cooled, the method may further include forming a first Mg layer on the cooled pinned layer, forming a first MgO layer by oxidizing the first MgO layer, forming a second Mg layer on the first MgO layer, forming a second MgO layer by oxidizing the second Mg layer, forming a free layer having CoFeB on the second MgO layer, forming a capping layer having Ta on the free layer, and forming an upper electrode on the capping layer. Again, one or more additional MgO layers may be formed on the second MgO layer before forming the free layer on the MgO multilayer structure. In addition, the multiple MgO layers may be unified to form a contiguous MgO layer.

In accordance with still another aspect of the inventive concepts, a method of fabricating an MRAM device may include forming a gate structure on a substrate, forming a source region and a drain region in the substrate adjacent to both sides of the gate structure, forming a source contact plug connected with the source region, and a source interconnection connected with the source plug, forming a lower electrode connected with the drain region, forming a ferromagnetic layer on the lower electrode, and then cooling the substrate having the ferromagnetic layer exposed thereon to a temperature within a range of approximately between about 50° K to about 300° K. After the substrate has been cooled, the method may further include forming a first Mg layer on the cooled ferromagnetic layer, forming a first MgO layer by oxidizing the first Mg layer, forming a second Mg layer on the first MgO layer, forming a second MgO layer by oxidizing the second Mg layer, forming a third Mg layer on the second MgO layer, forming a third MgO layer by oxidizing the third Mg layer, forming a free layer on the third MgO layer, and forming a capping layer on the free layer. One or more additional MgO layers may be formed on the third MgO layer before forming the free layer on the MgO multilayer structure. In addition, the MgO layers may be unified to form a contiguous MgO layer.

In accordance with yet another aspect of the inventive concepts, a semiconductor processing apparatus may include a load-lock chamber, a transfer chamber, a cooling chamber, a depositing chamber, and an oxidizing chamber. The processing apparatus may be configured to receive a substrate having a pinned layer formed thereon into the load-lock chamber, and may further be configured to transfer the substrate into the cooling chamber from the load-lock chamber using a transfer arm arranged in the transfer chamber. With the substrate arranged in the cooling chamber, the processing apparatus may be configured to cool the substrate in the cooling chamber to a temperature within a range of approximately between about 50° K to about 300° K. The processing apparatus may further be configured to move the cooled substrate to the depositing and oxidizing chambers to form a tunneling barrier layer on the cooled substrate.

Additional details regarding other embodiments of the inventive concepts are included in the detailed description and drawings.

BRIEF DESCRIPTION OF THE DRAWINGS

The foregoing and other features and advantages of the inventive concepts will be apparent from the following detailed description of preferred embodiments of the inventive concepts, as illustrated in the accompanying drawings in which like reference numerals denote the same or similar respective parts throughout the different views. The drawings are not necessarily to scale, however, and the emphasis of the drawings is instead placed upon illustrating the principles of the inventive concepts. In the drawings.

DETAILED DESCRIPTION OF THE EMBODIMENTS

Figure 1A:
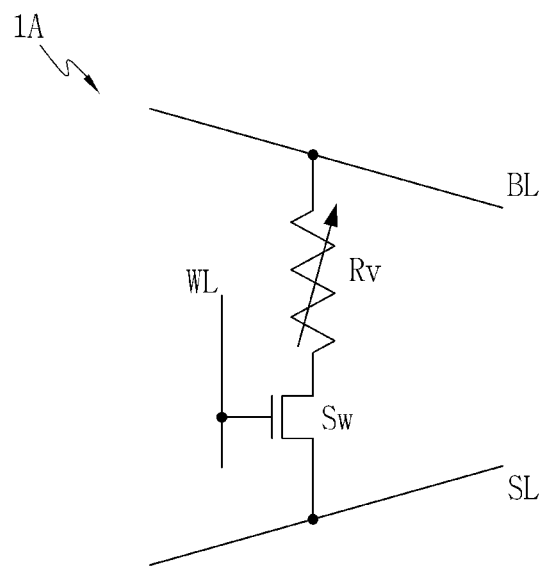
FIGS. 1A and 1B are equivalent schematic circuit diagrams of various magnetic resistive random access memory (MRAM) devices constructed in accordance with embodiments of the inventive concepts.

Exemplary embodiments of the present inventive concepts will now be described more fully with reference to the accompanying drawings. The inventive concepts may, however, be embodied in many different forms and should not be construed as being limited to the specific embodiments set forth herein. Rather, these embodiments are provided so that this disclosure will be through and complete, and will fully convey the inventive concepts to those of ordinary skill in the art. The scope of the present inventive concepts is defined by the appended claims.

The terminology used herein to describe embodiments of the inventive concepts is not intended to limit the scope of the inventive concepts. Although the articles "a," "an," and "the" are singular, for example, the use of the singular form in the present document does not preclude the presence of more than one referent. In other words, elements of the invention referred to in the singular form may include one or more of the identified elements, unless the context clearly indicates otherwise. Likewise, the terms "comprises," "comprising," "includes," and/or "including," when used herein, specify the presence of the stated features, integers, steps, operations, elements, and/or components, but do not preclude the presence or addition of one or more other features, integers, steps, operations, elements, components, and/or groups thereof.

When an element(s) is(are) referred to as being "connected" or "coupled" to other element(s), those elements may be directly connected or coupled to the other elements(s), or intervening elements may be present. On the other hand, an element(s) referred to as being "directly connected" or "directly coupled" to other element(s) has no intervening element(s) between those elements. The term "and/or" means that the recited feature may include any one of, or any combination of, the items mentioned.

Spatially relative terms, such as "beneath," "below," "lower," "above," "upper," and the like may be used herein to describe the relationship of one element or feature to another, as that relationship is illustrated in the drawings. It will be understood, however, that although such descriptions are intended to describe a specific orientation, these terms should not be construed as limiting the inventive concepts to any particular orientation. Rather, other orientations of the recited structure may be encountered in use or operation, in addition to orientations depicted in the drawings, and all such possible orientations should be construed as included within the scope of the inventive concepts unless expressly excluded. For example, if a device is turned over, elements described as "below" or "beneath" other elements or features would then be oriented "above" the other elements or features. Thus, the term "below" is intended to cover both above and below, depending upon overall device orientation. Likewise, the device may be rotated by any amount, and the spatially relative terms should be construed accordingly.

Embodiments may be described herein with reference to cross-sectional and/or planar illustrations that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, the inventive concepts should not be construed as being limited to the specific shapes of regions illustrated herein, but should be construed to include deviations from those shapes. For example, an implanted region illustrated in the drawings as a rectangle will, in reality, typically have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Like numerals refer to like elements throughout the specification. Accordingly, elements identified by the same numerals may be described with reference to one or more drawings in which they appear, but may not be described with respect to every drawing in which they appear.

Figure 1B:
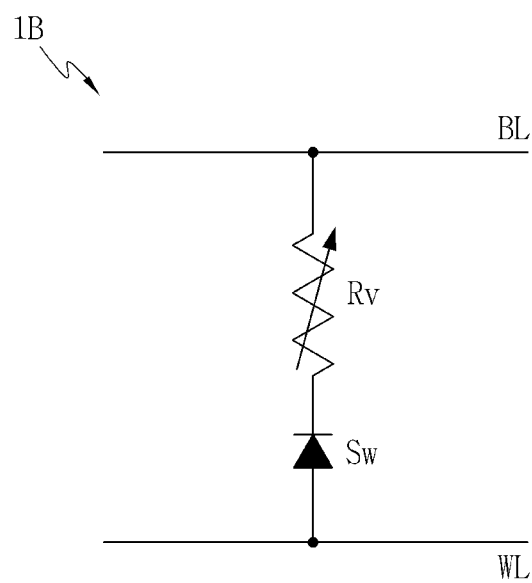

FIGS. 1A and 1B are equivalent circuit diagrams of magnetic resistive random access memory (MRAM) devices 1A and 1B, respectively, constructed in accordance with embodiments of the inventive concepts.

Referring to FIG. 1A, an MRAM device 1A constructed in accordance with an embodiment of the inventive concepts may include a source line SL, a switching device Sw, a word line WL, a variable resistor Rv, and a bit line BL. The switching device Sw may, for example, be a transistor. When a turn-on voltage is applied to the word line WL, the switching device Sw may be turned on, and a current may be supplied to the bit line BL through the variable resistor Rv from the source line SL. By varying a resistance value of the variable resistor Rv, an amount of current supplied to the bit line BL may be changed. The amount of the current may be used to denote a value of logic "1" or logic "0."

Referring to FIG. 1B, an MRAM device 1B constructed in accordance with another embodiment of the inventive concepts may include a word line WL, a switching device Sw, a variable resistor Rv, and a bit line BL. As illustrated here, the switching device Sw may include a diode rather than a transistor.

Figure 2A:
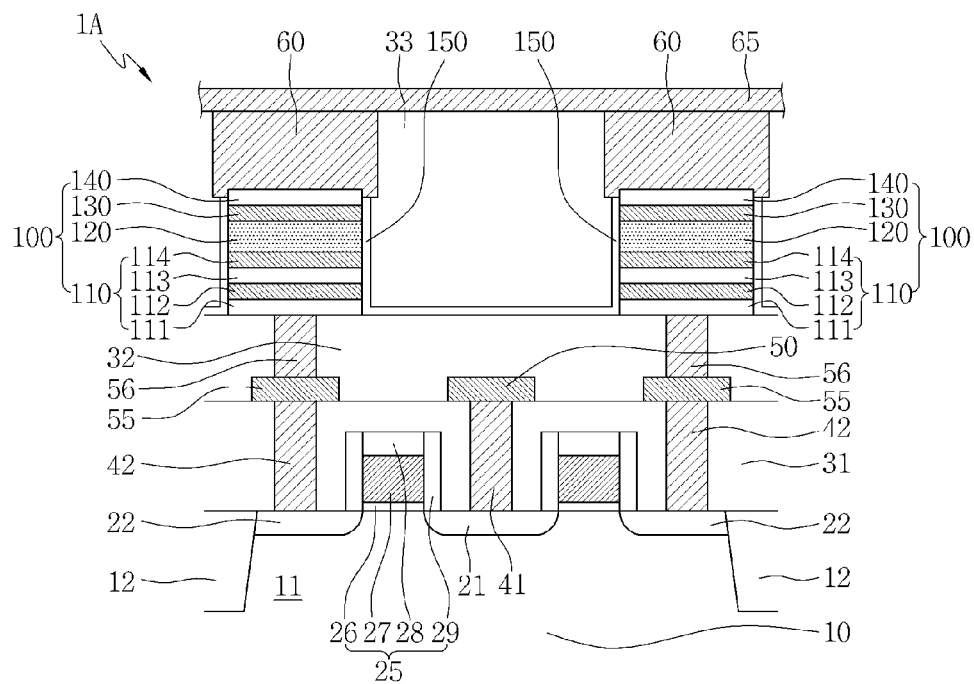
FIGS. 2A and 2B are schematic sectional views of various MRAM devices constructed in accordance with embodiments of the inventive concepts.
Figure 2B:
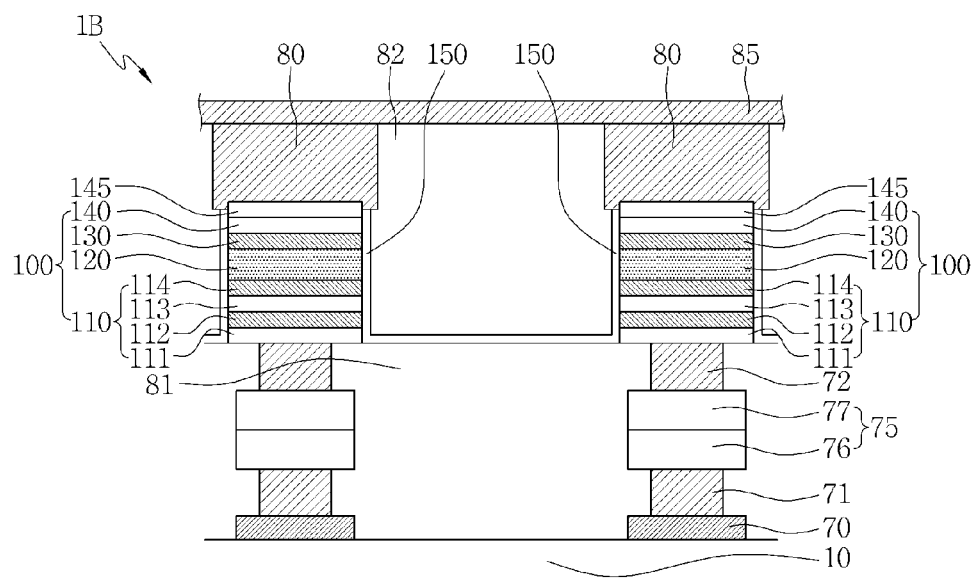

FIGS. 2A and 2B are schematic sectional views of MRAM devices 1A and 1B corresponding to the equivalent circuit diagrams of FIGS. 1A and 1B, respectively, in accordance with embodiments of the inventive concepts.

Referring to FIG. 2A, the MRAM device 1A, constructed in accordance with an embodiment of the inventive concepts, may include gate structures 25, a source interconnection 50, magneto resistive cells 100, and a bit line 65, all arranged on a substrate 10. The MRAM device 1A may further include isolation regions 12 defining an active region 11 in the substrate 10.

The gate structure 25 may be disposed on the active region 11. The gate structure 25 may include a gate insulating layer 26 directly disposed on a surface of the substrate 10, a gate electrode 27 on the gate insulating layer 26, a gate capping layer 28 on the gate electrode 27, and gate spacers 29 on sidewalls of the gate insulating layer 26, the gate electrode 27, and the gate capping layer 28. The gate insulating layer 26 may, for example, include silicon oxide ($SiO_2$, SiCO, SiCHO) or a metal oxide such as a hafnium oxide (HfO). The gate electrode 27 may, for example, include a conductor such as poly-silicon, a metal, a metal alloy, or a metal silicide. The gate capping layer 28 may include a dense insulating material such as silicon nitride (SiN). The gate spacer 29 may include silicon nitride (SiN) or silicon oxide ($SiO_2$).

A source region 21 and a drain region 22 may be disposed in the substrate 10 adjacent to both sides of the gate structure 25. The source region 21 and the drain region 22 may include one or more dopants such as boron (B), phosphorous (P), and/or arsenic (As).

The MRAM device may further include a lower interlayer insulating layer 31 covering the gate structure 25. The lower interlayer insulating layer 31 may include silicon oxide.

The MRAM device may further include a source contact plug 41 vertically passing through the lower interlayer insulating layer 31 to be connected with the source region 21, and a drain contact plug 42 vertically passing through the lower interlayer insulating layer 31 to be connected with the drain region 22. The source contact plug 41 and the drain contact plug 42 may each include a conductor such as poly-silicon, a metal, a metal alloy, or a metal silicide. Top surfaces of the lower interlayer insulating layer 31, the source contact plug 41, and the drain contact plug 42 may be substantially coplanar.

The source interconnection 50 may be disposed on the source contact plug 41. The source interconnection 50 may extend in a substantially horizontal direction. The source interconnection 50 may include a conductor such as poly-silicon, a metal, a metal alloy, or a metal silicide.

The MRAM device may further include a lower electrode pad 55 disposed on the drain contact plug 42. The lower electrode pad 55 may be disposed at substantially the same level as the source interconnection 50. The lower electrode pad 55 may include a conductor such as poly-silicon, a metal, a metal alloy, or a metal silicide. The lower electrode pad 55 may include the same material as the source interconnection 50.

The MRAM device 1A may further include a middle interlayer insulating layer 32 covering the source interconnection 50 and the lower electrode pad 55. The middle interlayer insulating layer 32 may, for example, include silicon oxide ($SiO_2$) or silicon nitride (SiN).

The MRAM device 1A may further include a lower electrode 56 vertically passing through the middle interlayer insulating layer 32 to be connected with the lower electrode pad 55. The lower electrode 56 may, for example, include a conductor such as poly-silicon, a metal, a metal alloy, or a metal silicide.

The magneto resistive cell 100 may be disposed on the lower electrode 56. The magneto resistive cell 100 may include a ferromagnetic layer 110, a tunneling barrier layer 120, a free layer 130, and a capping layer 140. The magneto resistive cell 100 may further include a hardmask 145 (see FIG. 2B) on the capping layer 140.

The ferromagnetic layer 110 may include a seed layer 111, a lower pinning layer 112, a synthetic anti-ferromagnetic (SAF) layer 113, and an upper pinned layer 114.

The seed layer 111 may provide a crystallization characteristic or crystallization orientation to the lower pining layer 112. The seed layer 111 may include a Ta layer and/or Ru layer. For example, the seed layer 111 may be formed as a double layer having a lower Ta layer and an upper Ru layer on the lower Ta layer.

The lower pinning layer 112 may include a CoPt-based alloy or CoPd-based alloy having a hexagonal closest packing (HDP) structure, or a stacked layer of Co/Pt and/or Co/Pd having a face center cubic (FCC) structure or FCC-like structure.

The SAF layer 113 may include an anti-ferromagnetic metal such as Ru.

The upper pinned layer 114 may include a CoFe-based material. For example, the upper pinned layer 114 may include CoFeB. In another embodiment, the upper pinned layer 114 may include a multilayer structure such as a stacked layer of CoFeB/Ta/CoFeB. In still another embodiment, the upper pinned layer 114 may include a multilayer structure such as a stacked layer of Co/B/CoFeB or a layer of Co/W/CoFeB/W/CoFeB.

The tunneling barrier layer 120 may include magnesium oxide (MgO). For example, the tunneling barrier layer 120 may be formed by depositing an Mg layer on the upper pinned layer 114 and oxidizing the deposited Mg layer.

The free layer 130 may, for example, include a CoFeB layer or a stacked layer of CoFeB/W/CoFeB.

The capping layer 140 may include a metal such as Ta.

The MRAM device 1A may further include a liner layer 150 surrounding sidewalls of the magneto resistive cell 100. The liner layer 150 may be conformally formed on the middle interlayer insulating layer 32. The liner layer 150 may, for example, include a metal oxide such as $Al_2O_3$ or silicon nitride (SiN).

The MRAM device 1A may further include an upper interlayer insulating layer 33 surrounding the magneto resistive cell 100. The upper interlayer insulating layer 33 may include silicon oxide ($SiO_2$).

The MRAM device 1A may further include an upper electrode 60 arranged in contact with an upper surface and upper portions of sidewalls of the capping layer 140. The upper electrode 60 may include a conductor such as poly-silicon, a metal, a metal alloy, or a metal silicide.

The bit line 65 may be disposed on the upper interlayer insulating layer 33 to be in contact with the upper electrode 60. The bit line 65 may extend in a substantially horizontal direction. The bit line 65 and the upper electrode 60 may be unified to be materially contiguous with each other.

Referring now to FIG. 2B, an MRAM device 1B in accordance with another embodiment of the inventive concepts may include a word line interconnection 70, a switching device 75, a magneto resistive cell 100, and a bit line interconnection 85 on the substrate 10.

The word line interconnection 70 may be buried in the substrate 10. The word line interconnection 70 may include a conductor such as a portion of the substrate 10, poly-silicon, a metal, a metal alloy, or a metal silicide.

The MRAM device 1B may further include a lower contact plug 71 between the word line interconnection 70 and the switching device 75. The lower contact plug 71 may include a conductor such as poly-silicon, a metal, a metal alloy, or a metal silicide.

The switching device 75 may include a diode. Accordingly, the switching device 75 may include an anode 76 and a cathode 77. The positions of the anode 76 and the cathode 77 are interchangeable with each other.

The MRAM device 1B may further include an upper contact plug 72 disposed between the switching device 75 and the magneto resistive cell 100. The upper contact plug 72 may include a conductor such as poly-silicon, a metal, a metal alloy, or a metal silicide.

The MRAM device 1B may further include a first interlayer insulating layer 81 surrounding the word line interconnection 70, the lower contact plug 71, the switching device 75, and the upper contact plug 72. The first interlayer insulating layer 81 may include silicon oxide ($SiO_2$).

The magneto resistive cell 100 may be disposed on the upper contact plug 72. The magneto resistive cell 100 may include a ferromagnetic layer 110, a tunneling barrier layer 120, a free layer 130, a capping layer 140, and a hardmask 145.

The ferromagnetic layer 110 may include a seed layer 111, a lower pinning layer 112, an SAF layer 113, and an upper pinned layer 114.

The seed layer 111, the lower pinning layer 112, the SAF layer 113, the upper pinned layer 114, the tunneling barrier layer 120, the free layer 130, and the capping layer 140 may all be substantially the same as described previously with respect to FIG. 2A.

The hardmask 145 may include a remaining metal after patterning the magneto resistive cell 100.

The MRAM device 1B may further include a liner layer 150 surrounding sidewalls of the magneto resistive cell 100. The liner layer 150 may be conformally formed on the first interlayer insulating layer 81. The liner layer 150 may include a metal oxide such as $Al_2O_3$ and silicon nitride (SiN).

The MRAM device 1B may include a second interlayer insulating layer 82 surrounding the magneto resistive cell 100. The second interlayer insulating layer 82 may include silicon oxide ($SiO_2$).

The MRAM device 1B may further include an upper electrode 80 arranged in contact with an upper surface and upper portions of sidewalls of the hardmask 145. The upper electrode 80 may include a conductor such as poly-silicon, a metal, a metal alloy, or a metal silicide.

The bit line interconnection 85 may be disposed on the second interlayer insulating layer 82 to be in contact with the upper electrode 80. The bit line interconnection 85 may extend in a substantially horizontal direction. The bit line interconnection 85 and the upper electrode 80 may be unified so as to be materially contiguous with each other.

FIGS. 3A to 3D are flowcharts illustrating a method of fabricating an MRAM device in accordance with embodiments of the inventive concepts. FIGS. 4A to 4S are sectional views of an MRAM device 1A during various stages of manufacture to assist in describing a method of fabricating an MRAM device 1A in accordance with an embodiment of the inventive concepts. The various processes of the method may be performed using an apparatus such as the processing apparatus 300 shown in FIG. 7.

Figure 3A:
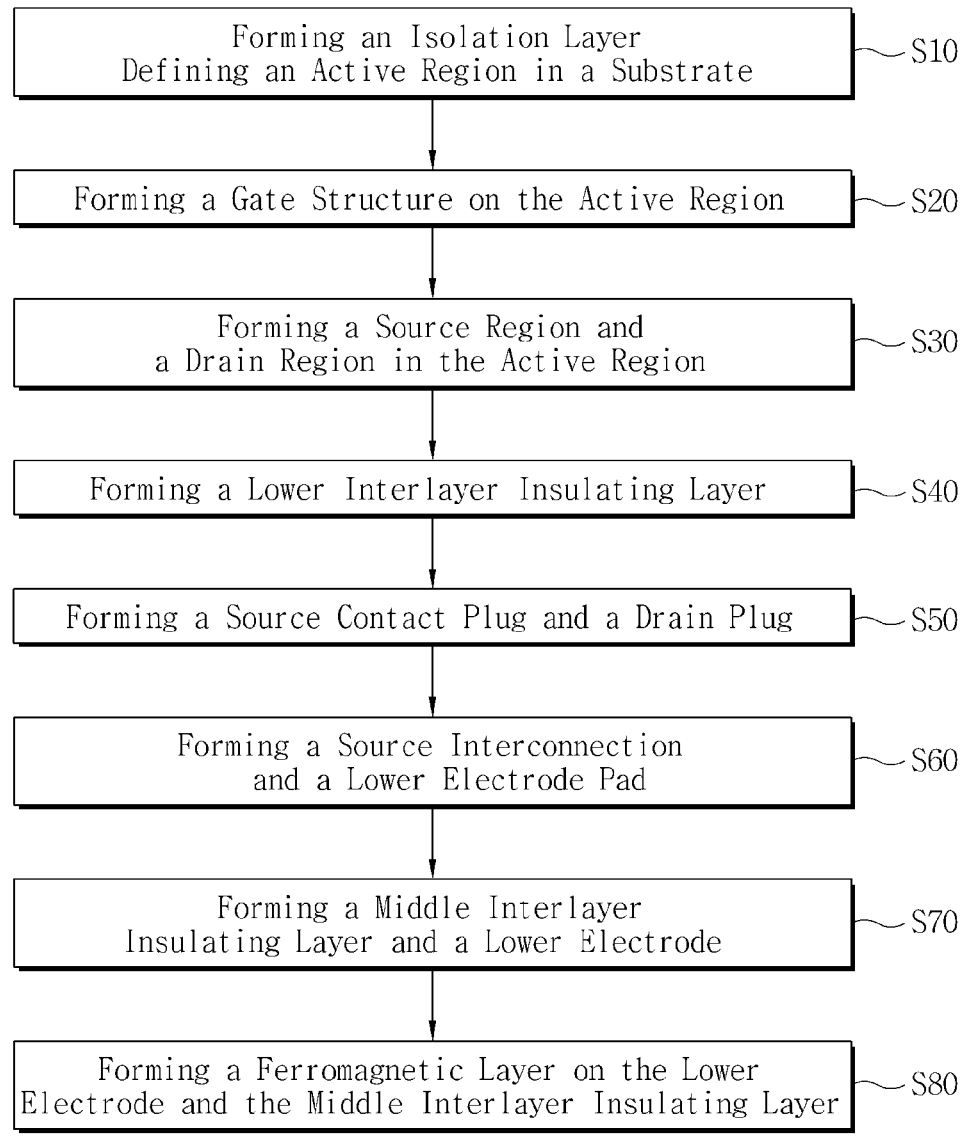
FIGS. 3A to 3D are flowcharts illustrating a method of fabricating an MRAM device in accordance with certain embodiments of the inventive concepts.
Figure 4A:
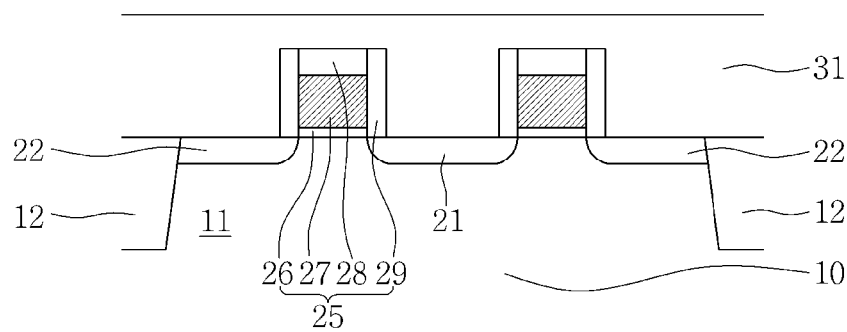
FIGS. 4A to 4S and FIGS. 5A to 5H provide sectional views of an MRAM device at various stages during manufacturing to schematically illustrate methods of fabricating MRAM devices in accordance with certain embodiments of the inventive concepts.

Referring to FIGS. 3A and 4A, a method of fabricating an MRAM device may include forming an isolation region 12 defining an active region 11 in a substrate 10 (step S10), forming a gate structure 25 on the active region 11 (step S20), forming a source region 21 and a drain region 22 in the active region 11 (step S30), and forming a lower interlayer insulating layer 31 covering the gate structure 25 (step S40).

The substrate 10 may, for example, include a silicon wafer, a silicon-on-insulator (SOI) wafer, or any semiconductor wafer having an epitaxial growth layer such as a silicon-germanium (SiGe) layer.

The isolation region 12 may include an insulating material such as silicon oxide ($SiO_2$) and/or silicon nitride (SiN) filling a trench.

The gate structure 25 may include a gate insulating layer 26 directly formed on the substrate 10, a gate electrode 27 arranged on the gate insulating layer 26, a gate capping layer 28 on the gate electrode 27, and gate spacers 29 on sidewalls of the gate insulating layer 26, the gate electrode 27, and the gate capping layer 28. The gate insulating layer 26 may include oxidized silicon or a metal oxide. The gate electrode 27 may include a conductor such as poly-silicon, a metal, a metal alloy, or a metal silicide. The gate capping layer 28 and the gate spacer 29 may include silicon nitride (SiN) or silicon oxide ($SiO_2$).

The source region 21 and the drain region 22 may be disposed in the substrate 10 adjacent to opposite sides of the gate structure 25, and may include one or more dopants such as boron (B), phosphorous (P), and/or arsenic (As).

The lower interlayer insulating layer 31 may include silicon oxide ($SiO_2$).

Figure 4B:
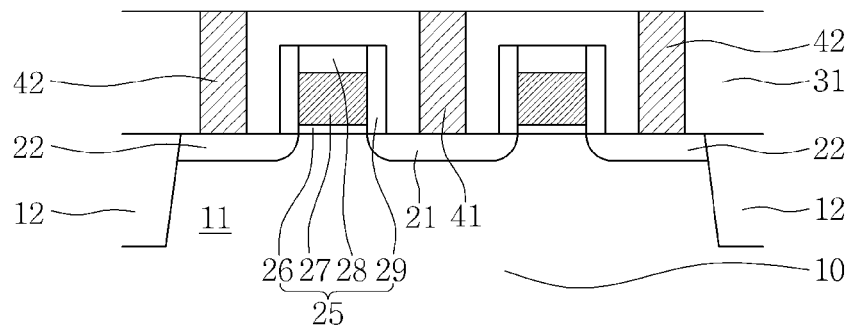

Referring to FIGS. 3A and 4B, the method may further include forming a source contact plug 41 and a drain contact plug 42 vertically passing through the lower interlayer insulating layer 31 to be connected with the source region 21 and the drain region 22, respectively. The source contact plug 41 and the drain contact plug 42 may include a conductor such as poly-silicon, a metal, a metal alloy, or a metal silicide. The method may further include planarizing top surfaces of the lower interlayer insulating layer 31, the source contact plug 41, and the drain contact plug 42 to be substantially coplanar with each other.

Figure 4C:
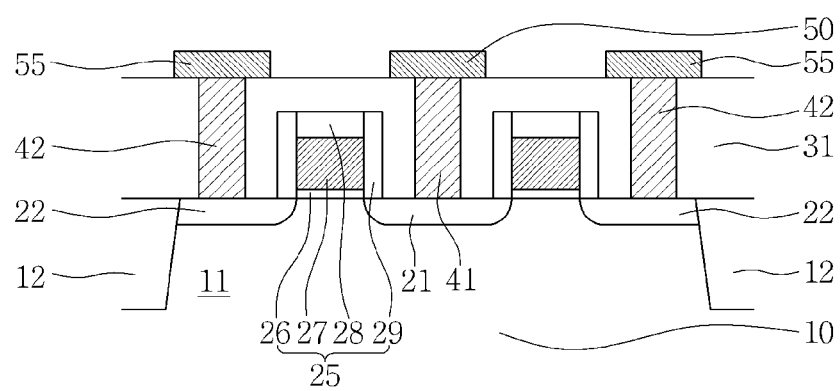

Referring to FIGS. 3A and 4C, the method may additionally include forming a source interconnection 50 on the source contact plug 41 and a lower electrode pad 55 on the drain contact plug 42 (step S60). The source interconnection 50 and the lower electrode pad 55 may include a conductor such as poly-silicon, a metal, a metal alloy, or a metal silicide. The source interconnection 50 may extend in a substantially horizontal direction. The lower electrode pad 55 may, for example, have a circular shape or polygonal shape when viewed in a top plan view.

Figure 4D:
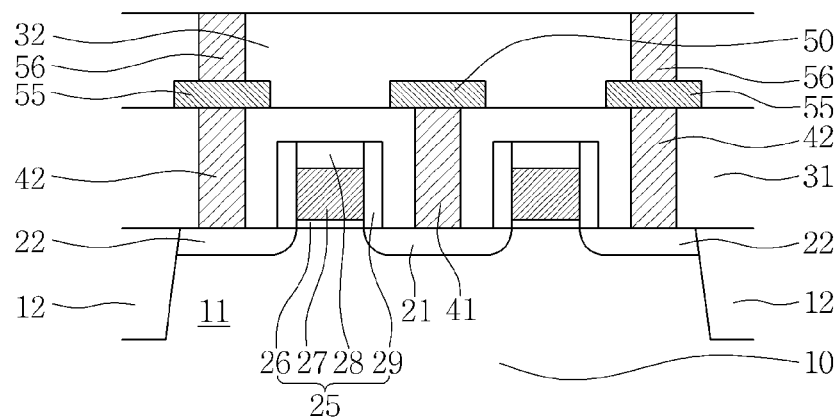

Referring to FIGS. 3A and 4D, the method may include forming a middle interlayer insulating layer 32 covering the source interconnection 50 and the lower electrode pad 55, and forming a lower electrode 56 vertically passing through the middle interlayer insulating layer 32 to be connected with the lower electrode pad 55 (step S70).

The middle interlayer insulating layer 32 may include an insulating material such as silicon oxide ($SiO_2$).

The lower electrode 56 may include a conductor such as poly-silicon, a metal, a metal alloy, or a metal silicide. The method may further include planarizing top surfaces of the middle interlayer insulating layer 32 and the lower electrode 56 to be substantially coplanar.

Figure 3B:
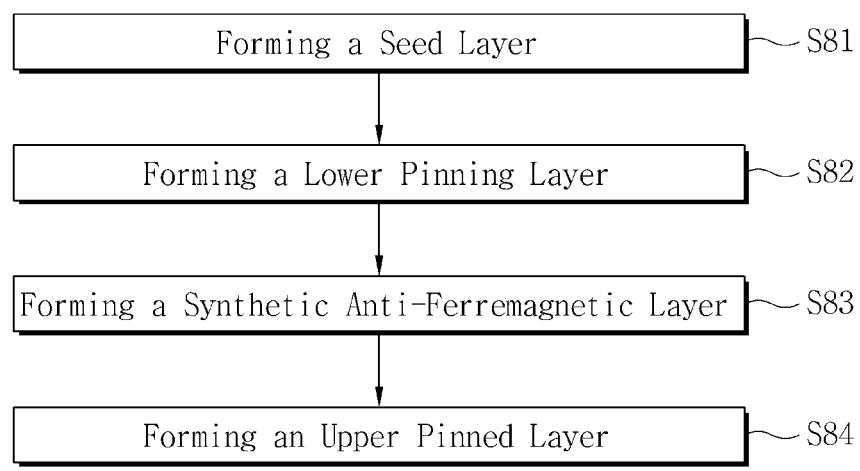
Figure 4E:
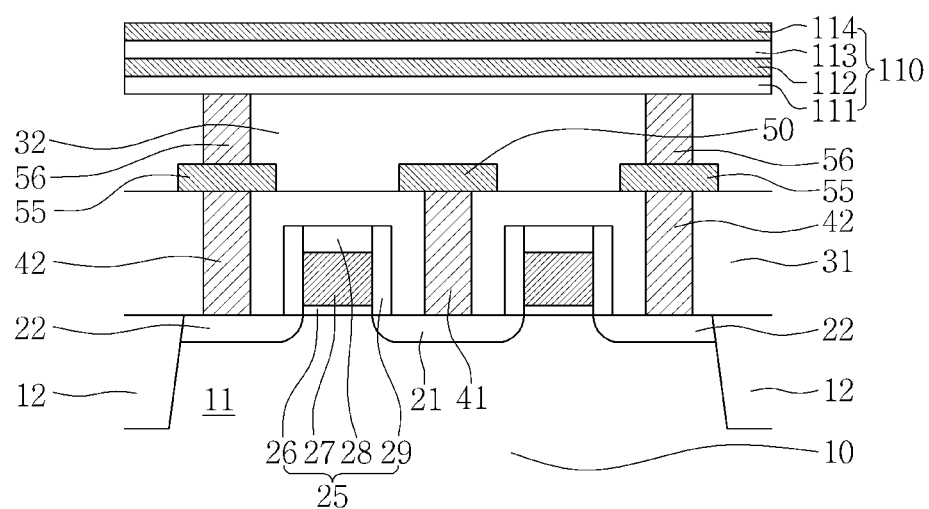

Referring to FIGS. 3A and 4E, the method may also include forming a ferromagnetic layer 110 on the lower electrode 56 and the middle interlayer insulating layer 32 (step S80). Referring additionally to FIG. 3B, forming the ferromagnetic layer 110 may include forming a seed layer 111 (step S81), forming a lower pinning layer 112 on the seed layer 111 (step S82), forming an SAF layer 113 on the lower pinning layer 112 (step S83), and forming an upper pinned layer 114 on the SAF layer 113 (step S84).

The seed layer 111 may include a Ta layer and/or Ru layer. For example, the seed layer 111 may be formed of a double layer having a lower Ta layer and an upper Ru layer stacked on the lower Ta layer.

The lower pinning layer 112 may include at least one of CoPt based alloys or CoPd based alloys having HDP structure, or a stacked layer of Co/Pt and/or Co/Pd having a FCC structure or FCC-like structure.

The SAF layer 113 may include an anti-ferromagnetic metal such as Ru.

The upper pinned layer 114 may include a CoFe-based material. For example, the upper pinned layer 114 may include CoFeB. In another embodiment, the upper pinned layer 114 may include a multilayer structure such as a stacked layer of CoFeB/Ta/CoFeb. In still another embodiment, the upper pinned layer 114 may include a multilayer structure such as a stacked layer of Co/B/CoFeB and/or a layer of Co/W/CoFeB/W/CoFeB.

The seed layer 111, the lower pinning layer 112, the SAF layer 113, and the upper pinned layer 114 may be formed by performing a physical vapor deposition (PVD) process such as a sputtering process. In another embodiment, the lower pinning layer 112 may be formed by performing a metallic organic chemical vapor deposition (MOCVD) process.

Figure 3C:
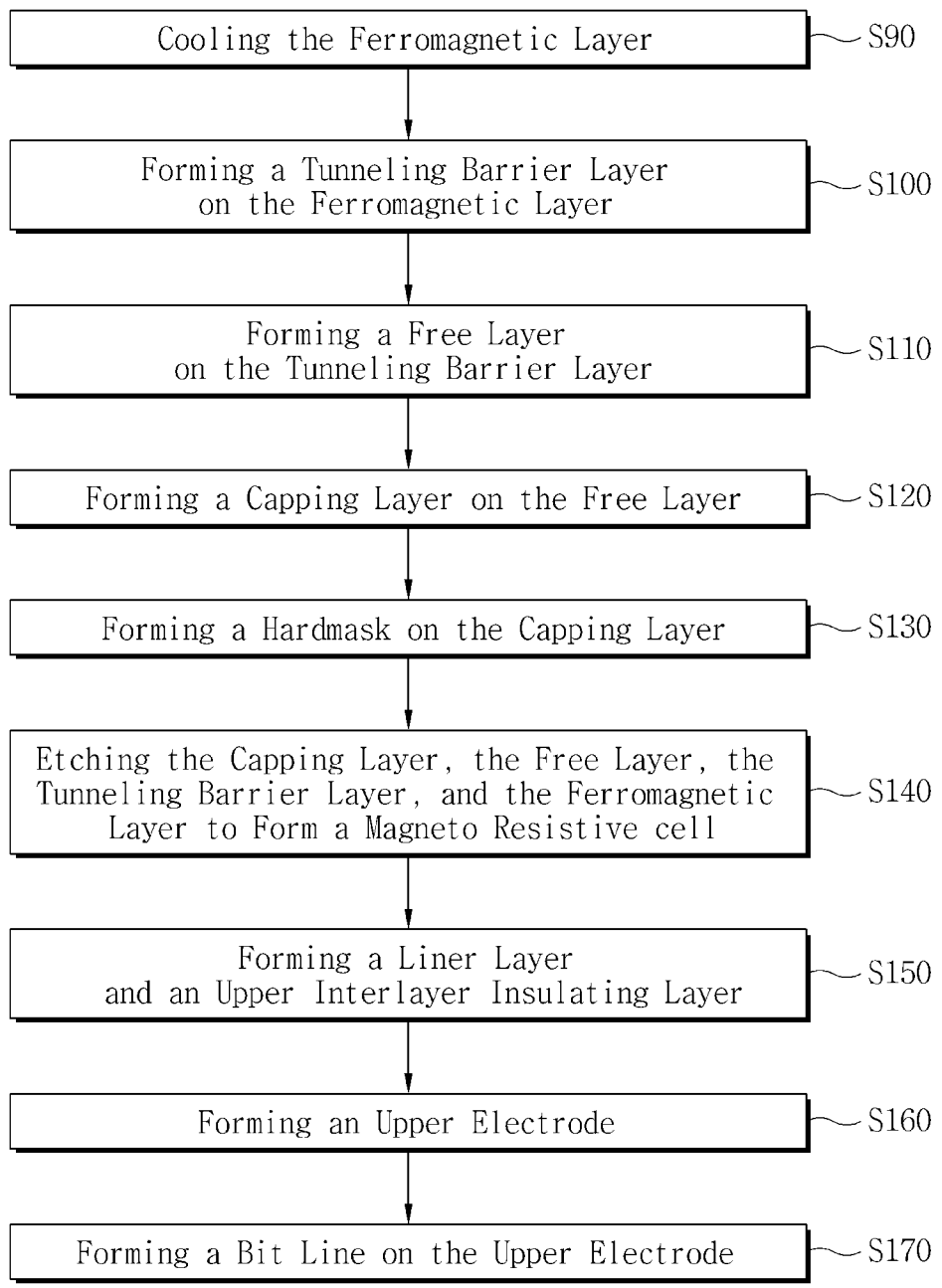

Referring to FIG. 3C, the method may include cooling the ferromagnetic layer 110 before forming a tunneling barrier layer 120. Specifically, the method may include cooling the upper pinned layer 114 (step S90). To do this, the substrate 10 may be transferred into a cooling chamber 340 (see FIG. 7) after forming the upper pinned layer 114, and the cooling process may then be performed on the substrate 10 having the upper pinned layer 114 formed thereon. The cooling process may include cooling the substrate 10 having the upper pinned layer 114 formed thereon to a temperature within a range of approximately between about 50° K (−223° C.) to about 300° K (−27° C.). It may be desirable, for instance, to cool the substrate 10 to a temperature within a range of approximately between about 100° K (−173° C.) to about 150° K (−123° C.). The cooling process may be performed using a refrigerant such as a liquid helium gas or a liquid nitrogen gas introduced into a hermetic cooling chamber 340 (see FIG. 7).

Referring to FIG. 3C, after cooling the substrate 10, the method may further include forming a tunneling barrier layer 120 on the cooled ferromagnetic layer 110 (step S100).

Figure 3D:
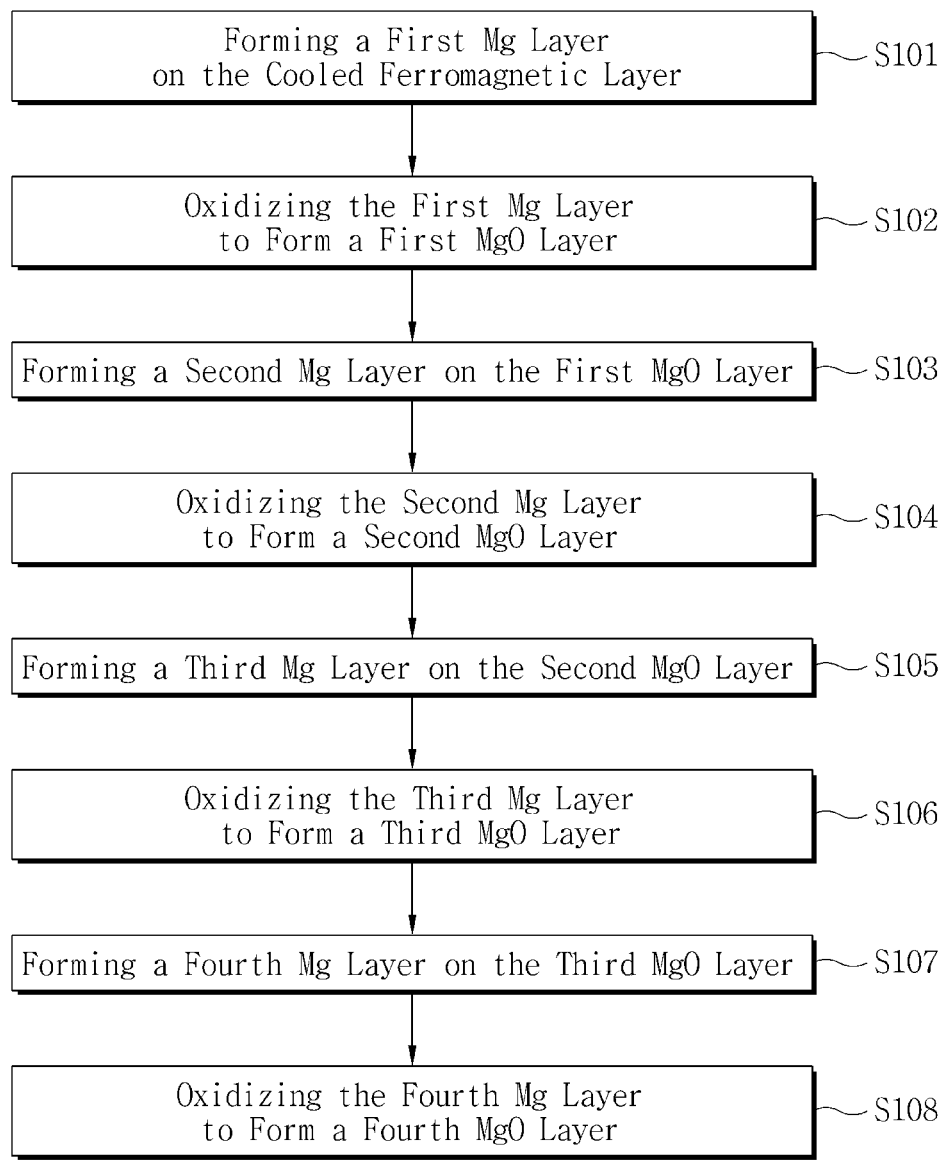
Figure 4F:
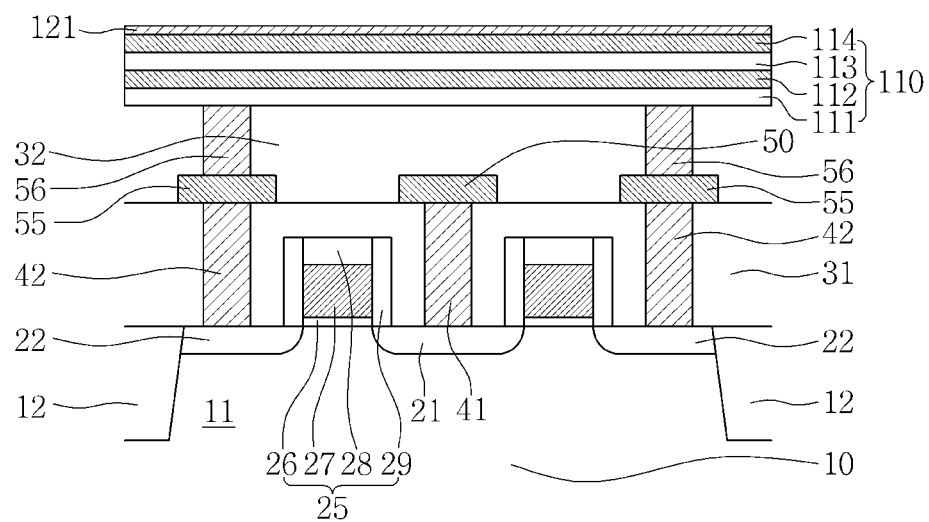

Referring to FIGS. 3D and 4F, the method may include forming a first Mg layer 121 on the cooled upper pinned layer 114 by performing a first Mg depositing process (step S101). To do this, the substrate 10, having the cooled pinned layer 114 formed thereon, may be transferred from the cooling chamber 340 (see FIG. 7) into a depositing chamber 330 (see FIG. 7). A first Mg depositing process may then be performed on the substrate 10. The first Mg depositing process may include a PVD process such as a sputtering process.

Figure 4G:
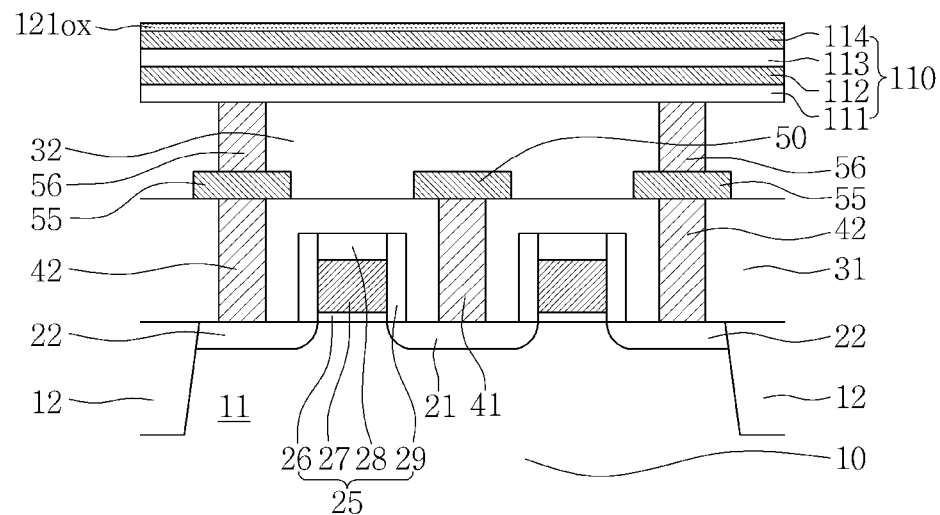
Figure 7:
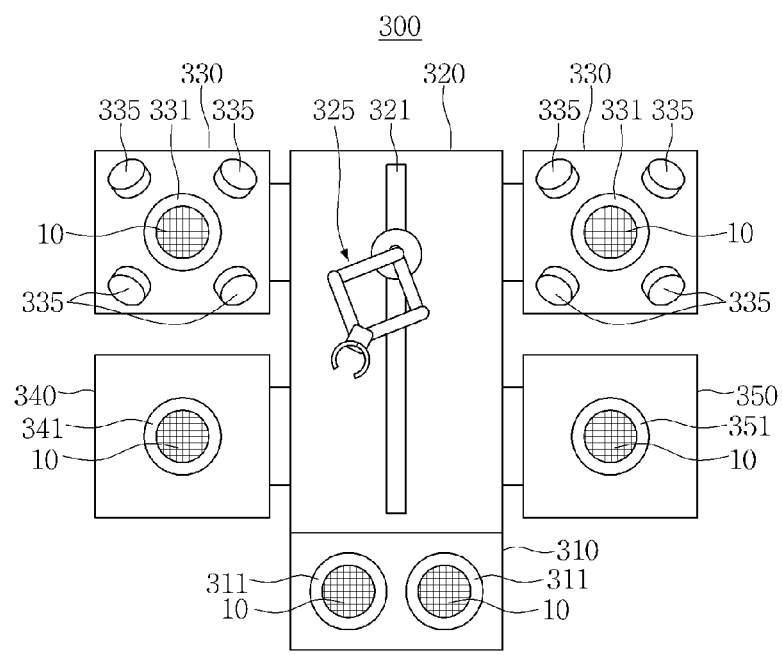
FIG. 7 is a schematic illustration of a processing apparatus for fabricating a MRAM device, in accordance with another embodiment of the inventive concepts.

Referring to FIGS. 3D, 4G, and 7, the method may include oxidizing the first Mg layer 121 to form a first MgO layer 121*ox* by performing a first Mg oxidizing process (step S102). For example, the method may include transferring the substrate 10 having the first Mg layer 121 formed thereon from the depositing chamber 330 into an oxidizing chamber 350. The first Mg layer 121 my then be oxidized by supplying $O_2$ gas or $H_2O$ vapor into the oxidizing chamber 350.

In another embodiment, the cooling process which cools the upper pinned layer 114 may be omitted, and the method may include cooling the first Mg layer 121 in the cooling chamber 340 before oxidizing the first Mg layer 121.

Figure 4H:
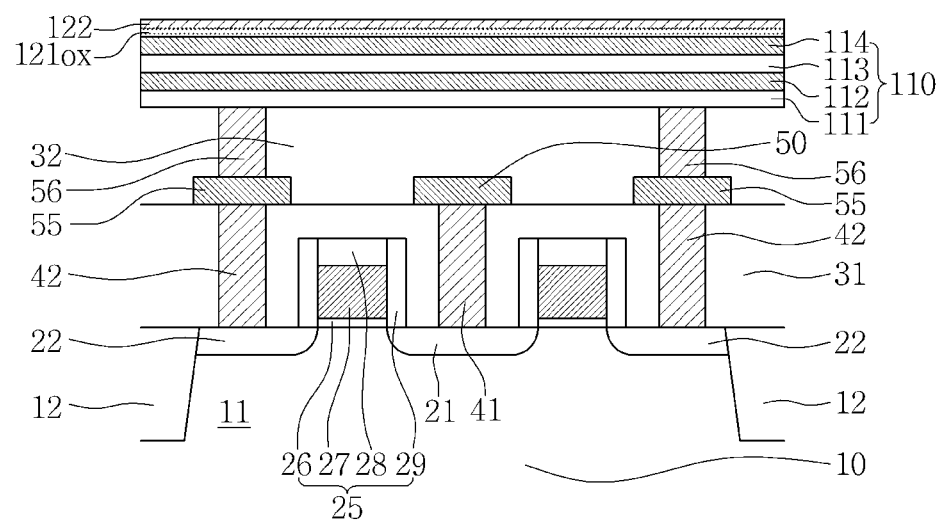

Referring to FIGS. 3D, 4H, and 7, the method may include forming the second Mg layer 122 on the first MgO layer 121*ox* by performing a second Mg depositing process (step S103). For example, the method may include transferring the substrate 10 having the first MgO layer 121*ox* formed thereon into the depositing chamber 330, and then performing the second Mg depositing process. The second Mg depositing process may include a PVD process such as a sputtering process.

In another embodiment, the method may further include cooling the first MgO layer 121*ox* in the cooling chamber 340 before forming the second Mg layer 122.

Figure 4I:
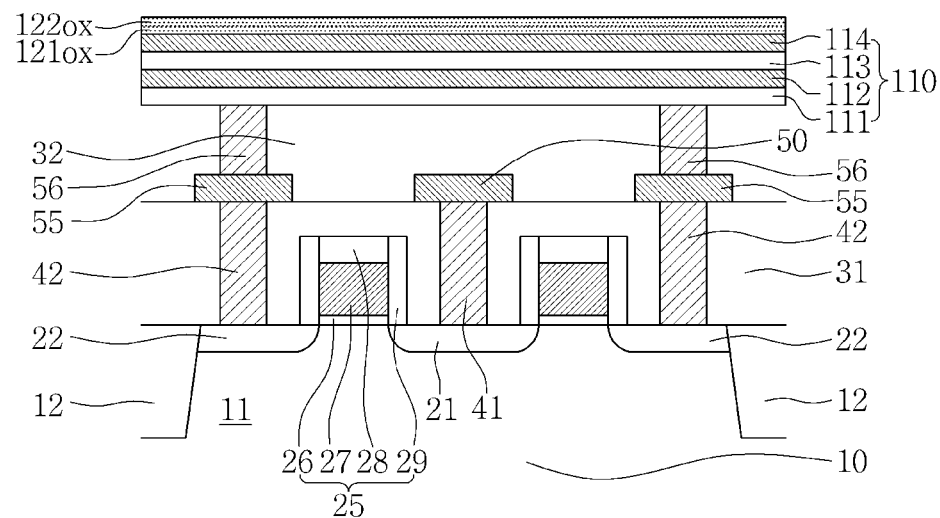

Referring to FIGS. 3D, 4I, and 7, the method may include oxidizing the second Mg layer 122 to form a second MgO layer 122*ox* by performing a second Mg oxidizing process (step S104). For example, the method may include transferring the substrate 10 having the second Mg layer 122 formed thereon into the oxidizing chamber 350, and then oxidizing the second Mg layer 122 by supplying $O_2$ gas or $H_2O$ vapor into the oxidizing chamber 350.

In another embodiment, the method may include cooling the second Mg layer 122 in the cooling chamber 340 before oxidizing the second Mg layer 122.

The first MgO layer 121*ox* and the second MgO layer 122*ox* may be unified to be materially contiguous with each other. Accordingly, an identifiable boundary between the first MgO layer 121*ox* and the second MgO layer 122*ox* may not actually exist. In FIG. 4I, the boundary is a virtual boundary indicated using a dotted line.

Figure 4J:
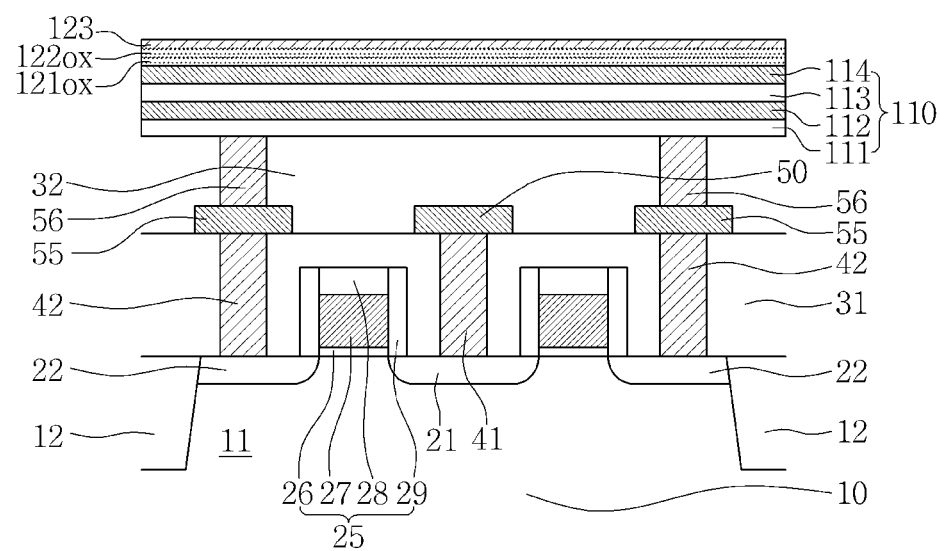

Referring to FIGS. 3D, 4J, and 7, the method may include forming a third Mg layer 123 on the second MgO layer 122*ox* by performing a third Mg depositing process (step S105) in the depositing chamber 330.

In another embodiment, the method may include cooling the second MgO layer 122*ox* in the cooling chamber 340 before forming the third Mg layer 123.

Figure 4K:
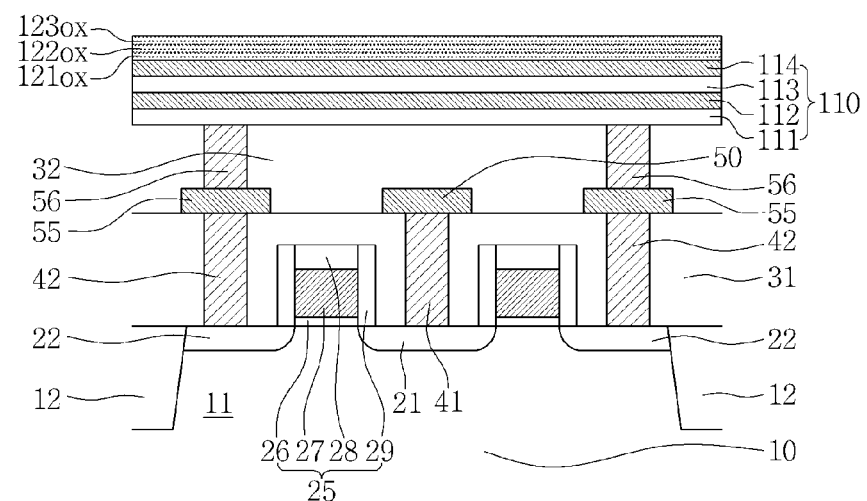

Referring to FIGS. 3D, 4K, and 7, the method may include oxidizing the third Mg layer 123 to form a third MgO layer 123*ox* by performing a third Mg oxidizing process (step S106) in the oxidizing chamber 350. In another embodiment, the method may include cooling the third Mg layer 123 in the cooling chamber 340 before oxidizing the third Mg layer 123.

Figure 4L:
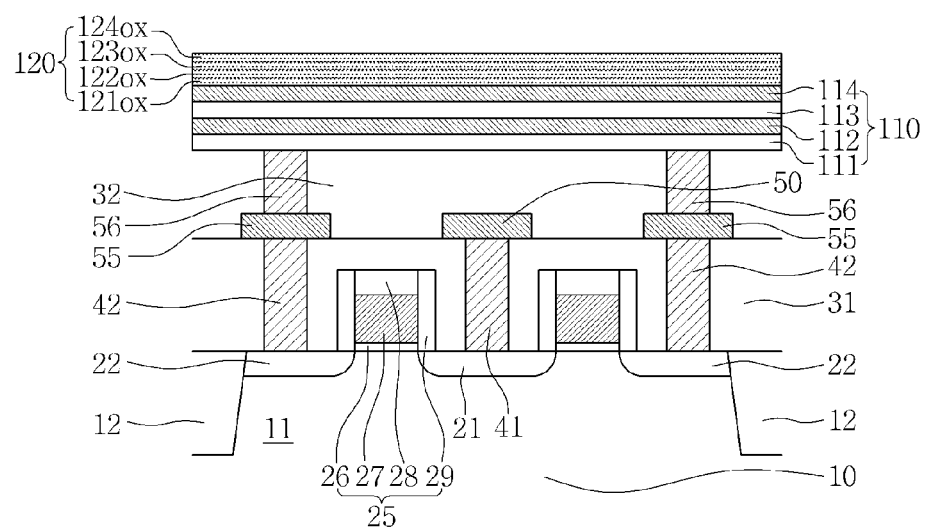

Referring to FIGS. 3D, 4L, and 7, the method may include forming a fourth MgO layer 124*ox* by forming a fourth Mg layer on the third MgO layer 123*ox* in the depositing chamber 330 using a fourth Mg layer depositing process (step S107), and oxidizing the fourth Mg layer in the oxidizing chamber 350 to form the fourth MgO layer 124*ox* using a fourth Mg oxidizing process (step S108). The MgO layers may collectively form an MgO structure. In other embodiments, at least one of the Mg depositing processes and/or at least one of the Mg oxidizing processes may be omitted, or additional Mg layer depositing and oxidizing processes may be performed. One or more processes may further be performed in a single chamber, rather than moving the substrate 10 between chambers. In another embodiment, the method may include cooling the third MgO layer 123 before forming the fourth Mg layer and/or cooling the fourth Mg layer before oxidizing the fourth Mg layer.

The first MgO layer 121*ox*, the second MgO layer 122*ox*, the third MgO layer 123*ox*, and the fourth MgO layer 124*ox* may be unified to be materially contiguous with each other, and may collectively form a tunneling barrier layer 120.

Figure 4M:
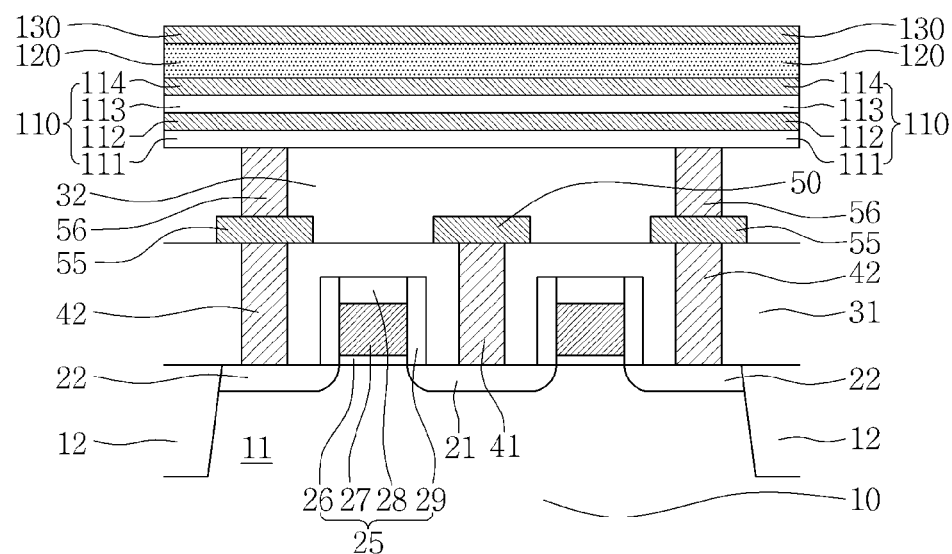

Referring to FIGS. 3C and 4M, the method may include forming a free layer 130 on the tunneling barrier layer 120 (step S110). The free layer may include a single layer of CoFeB or a multilayer of CoFeB/W/CoFeb. The free layer 130 may be formed by a PVD process such as sputtering processes.

Figure 4N:
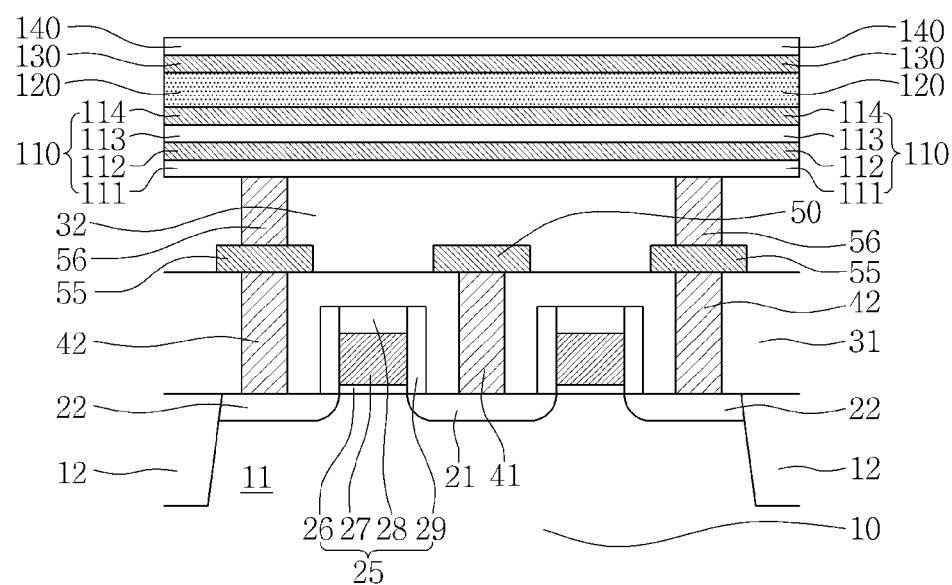

Referring to FIGS. 3C and 4N, the method may include forming a capping layer 140 on the free layer 130 (step S120). The capping layer 140 may include a metal such as Ta. The capping layer 140 may be formed by performing a PVD process such as a sputtering process.

Figure 4O:
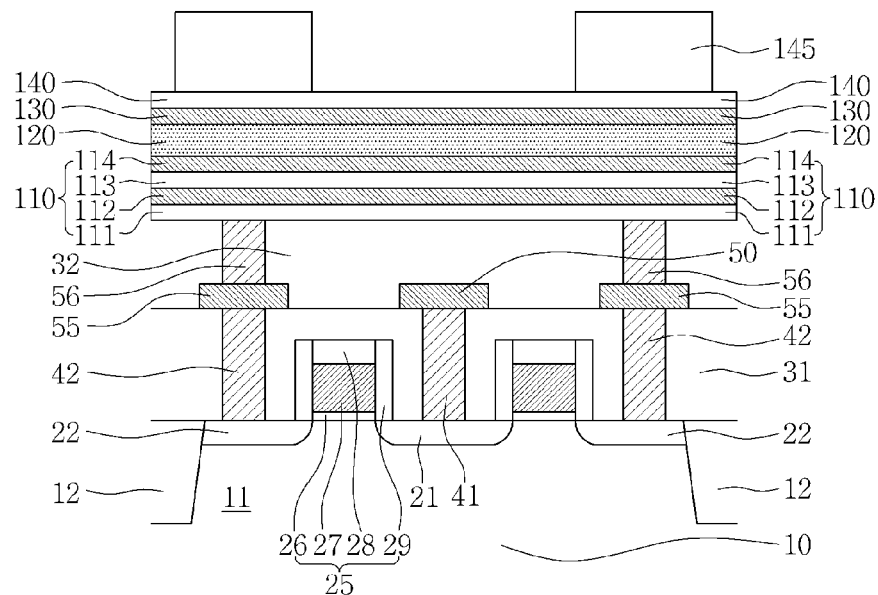

Referring to FIGS. 3C and 4O, the method may include forming a hardmask 145 on the capping layer 140 (step S130). The hardmask 145 may include a metal.

Figure 4P:
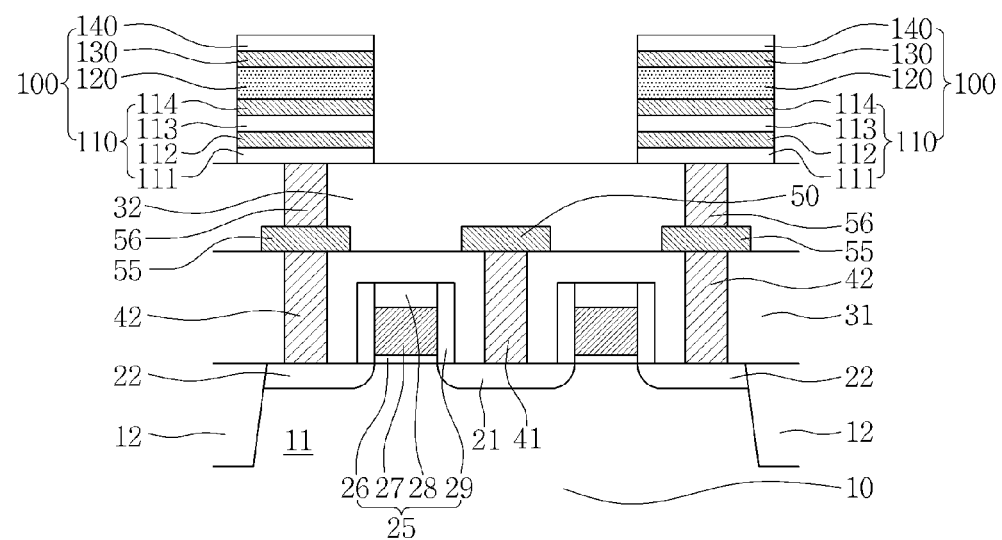

Referring to FIGS. 3C and 4P, the method may include forming a magneto resistive cell 100 by etching the capping layer 140, the free layer 130, the tunneling barrier layer 120, and the ferromagnetic layer 110 using the hardmask 145 as an etch mask (step S140). In another embodiment, the hardmask 145 may remain on the capping layer 140 of the magneto resistive cell 100.

Figure 4Q:
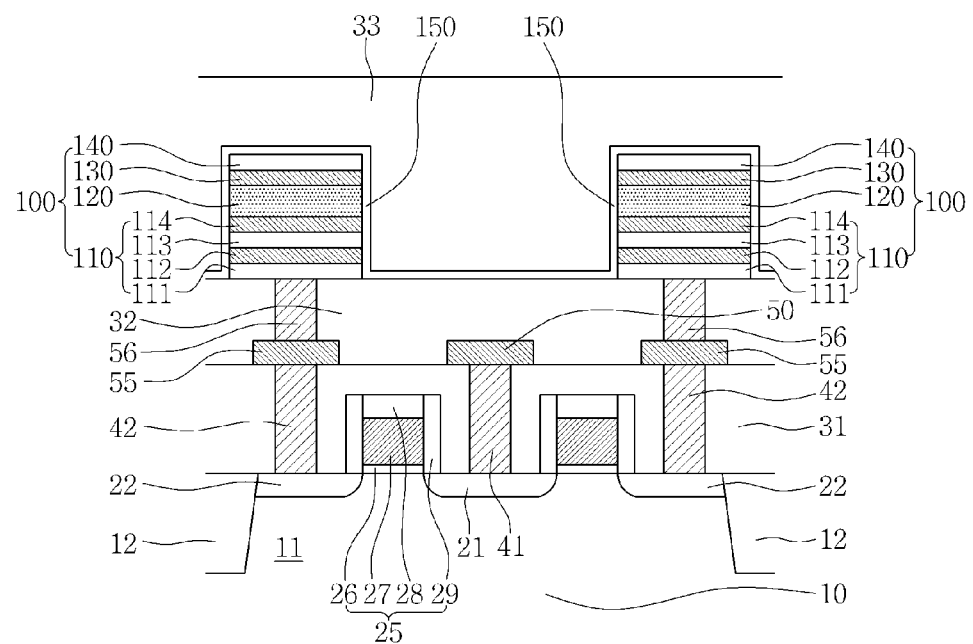

Referring to FIGS. 3C and 4Q, the method may include forming a liner layer 150 conformally surrounding the magneto resistive cell 100, and forming an upper interlayer insulating layer 33 covering the magneto resistive cell 100 and the liner layer 150 (step S150). The liner layer 150 may be conformally formed on an upper surface and side surfaces of the magneto resistive cell 100, and on an upper surface of the middle interlayer insulating layer 32. The liner layer 150 may, for example, include a metal oxide such as $Al_2O_3$ or silicon nitride (SiN). The upper interlayer insulating layer 33 may include silicon oxide ($SiO_2$). In another embodiment, when the hardmask 145 remains on the capping layer 140, the liner layer 150 may be conformally formed on an upper surface and side surfaces of the hardmask 145.

Figure 4R:
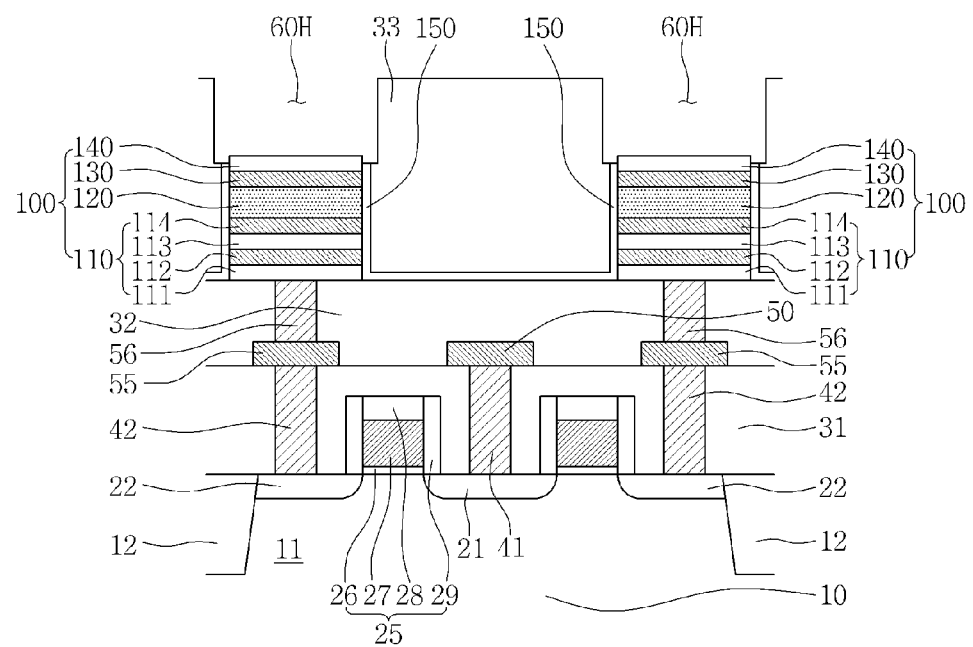
Figure 4S:
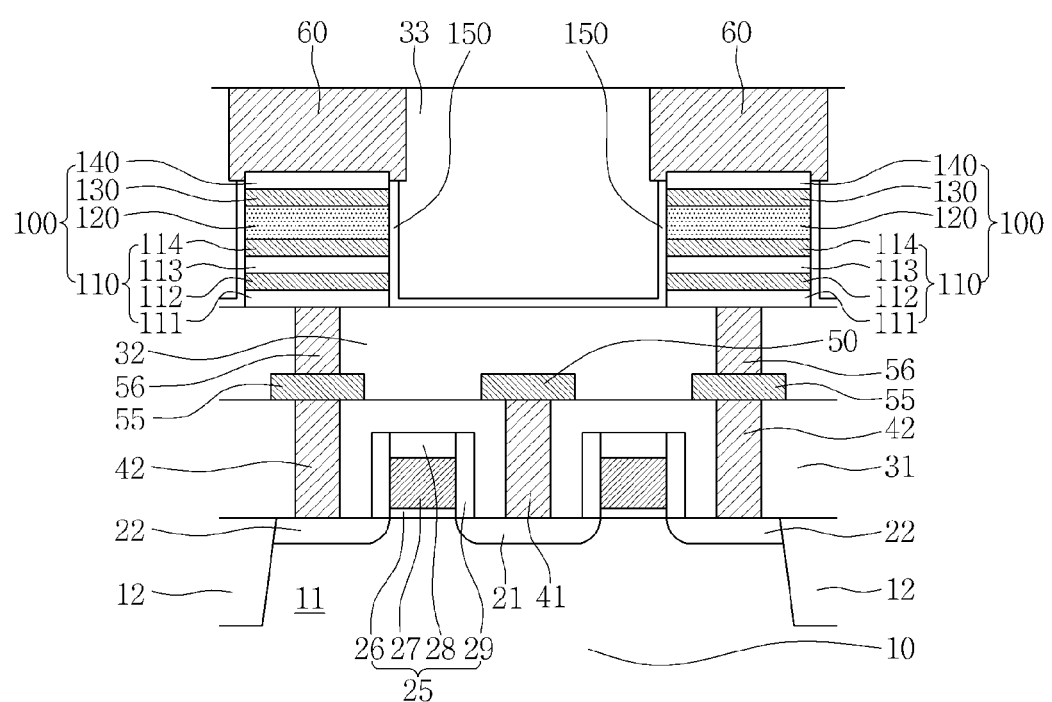

Referring to FIGS. 3C and 4R, the method may include forming an upper electrode hole 60H vertically passing through the upper interlayer insulating layer 33 and the liner layer 150 to expose the capping layer 140 of the magneto resistive cell 100. The upper electrode hole 60H may completely expose an upper surface of the capping layer 140 and may partially expose upper portions of sidewalls of the capping layer 140. For example, a diameter or horizontal width of the upper electrode hole 60H may be greater than a horizontal width or a horizontal length of the upper surface of the capping layer 140 of the magneto resistive cell 100. In another embodiment, when the hardmask 145 remains on the capping layer 140, the upper electrode hole 60H may completely expose an upper surface of the hardmask 145 and may partially expose upper portions of sidewalls of the hardmask 145.

Referring to FIGS. 3C and 4S, the method may include forming an upper electrode 60 filling the upper electrode hole 60H, such that the upper electrode 60 may be connected with the upper surface and the upper portions of the sidewalls of the capping layer 140 (step S160). The upper electrode 60 may include a metal such as W or Cu. The upper electrode 60 may further include a barrier layer including TiN or TaN conformally formed on an inner wall of the upper electrode hole 60H and on the exposed surfaces of the capping layer 140. In another embodiment, when the hardmask 145 remains on the capping layer 140, the upper electrode 60 may be in contact with the upper surface and the upper portions of the sidewalls of the hardmask 145.

Further referring to FIGS. 3C and 2A, the method may further include forming a bit line 65 on the upper electrode 60 (step S170). The bit line 65 may include a metal such as W or Cu.

FIGS. 5A to 5H are sectional views of an MRAM device during various stages of manufacture illustrating a method of fabricating an MRAM device 1B in accordance with another embodiment of the inventive concepts.

Figure 5A:
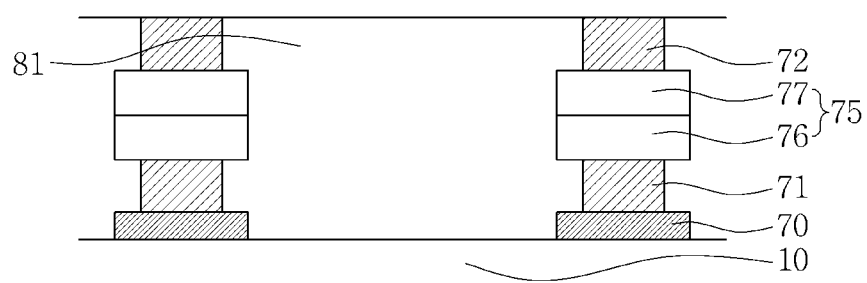

Referring to FIG. 5A, the method of fabricating an MRAM device 1B in accordance with an embodiment of the inventive concepts may include forming a word line interconnection 70 on a substrate 10, forming a lower contact plug 71 on the word line interconnection 70, forming a switching device 75 on the lower contact plug 71, forming an upper contact plug 72 on the switching device 75, and forming a first interlayer insulating layer 81 surrounding the word line interconnection 70, the lower contact plug 71, the switching device 75, and the upper contact plug 72.

The word line interconnection 70 may be buried in the substrate 10. The word line interconnection 70 may extend in a substantially horizontal direction. The word line interconnection 70 may include a conductor such as a portion of the substrate 10, poly-silicon, a metal, a metal alloy, or a metal silicide.

The lower contact plug 71 may electrically connect the word line interconnection 70 to the switching device 75. The lower contact plug 71 may include a conductor such as poly-silicon, a metal, a metal alloy, or a metal silicide.

The switching device 75 may include a diode. Accordingly, the switching device 75 may include an anode 76 and a cathode 77. The positions of the anode 76 and cathode 77 are interchangeable with respect to each other.

The upper contact plug 72 may be electrically connected with the switching device 75. The upper contact plug 72 may include a conductor such as poly-silicon, a metal, a metal alloy, or a metal silicide.

The first interlayer insulating layer 81 may include silicon oxide ($SiO_2$).

Figure 5B:
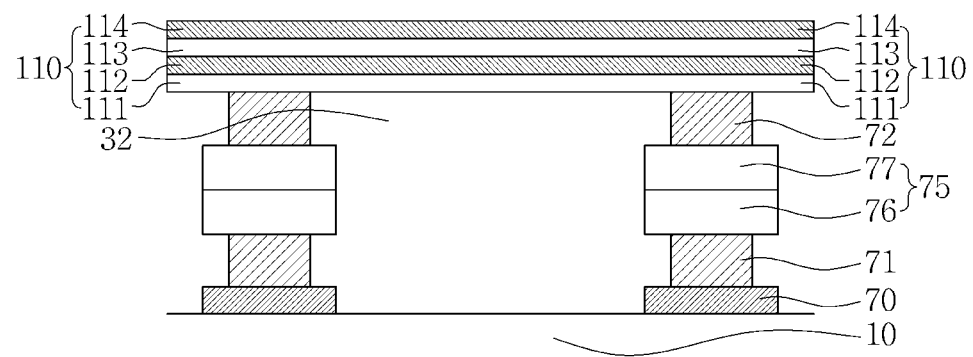

Referring to FIG. 5B, the method may include forming a ferromagnetic layer 110 on the upper contact plug 72 and the first interlayer insulating layer 81. The ferromagnetic layer 110 may include a seed layer 111, a lower pinning layer 112, an SAF layer 113, and an upper pinned layer 114. A method of forming the ferromagnetic layer 110 may include performing processes similar to those described previously with reference to FIG. 4E.

The method may further include cooling the ferromagnetic layer 110, e.g., the upper pinned layer 114, by performing a cooling process. For example, after forming the upper pinned layer 114, the substrate 10 may be transferred into a cooling chamber 340 (see FIG. 7). The cooling process may then be performed by cooling the substrate 10 having the upper pinned layer 114 formed thereon to a temperature within a range of approximately between about 50° K (−223° C.) to about 300° K (−27° C.). A desired temperature may, for example, be in the range of between about 100° K (−173° C.) to about 150° K (−123° C.). The cooling process may be performed using a refrigerant such as a liquid helium gas or a liquid nitrogen gas introduced into the hermetic cooling chamber 340 (see FIG. 7).

Figure 5C:
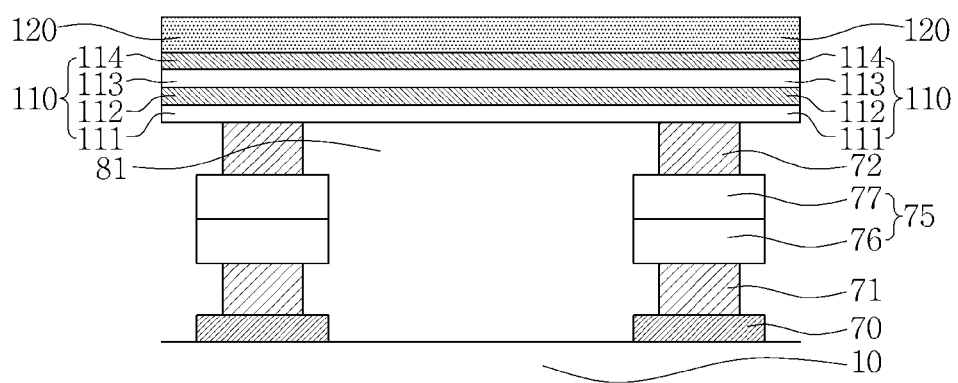

Referring to FIG. 5C, the method may include forming a tunneling barrier layer 120 on the cooled ferromagnetic layer 110 by performing processes such as those described with reference to FIGS. 4F to 4L.

Figure 5D:
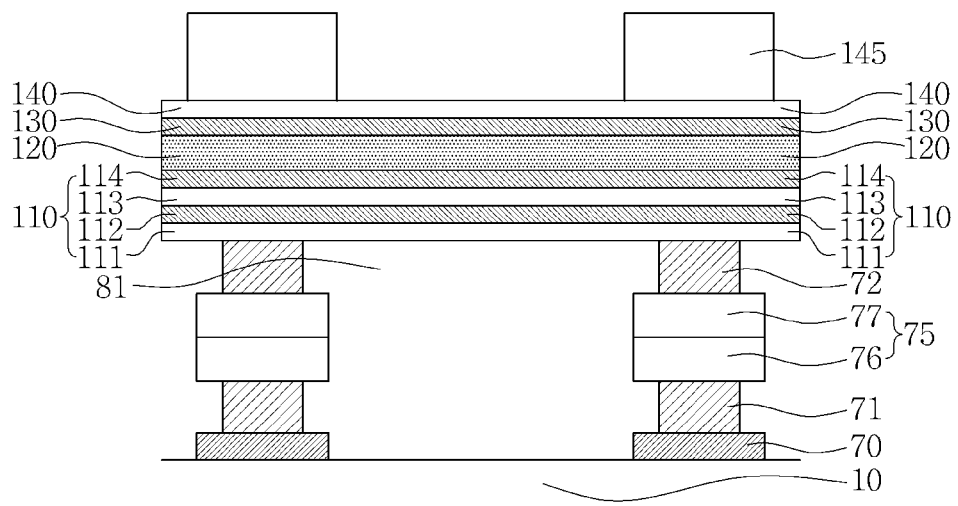

Referring to FIG. 5D, the method may include forming a free layer 130, a capping layer 140, and a hardmask 145 on the tunneling barrier layer 120 by performing processes similar to those described with reference to FIGS. 4M to 4O.

Figure 5E:
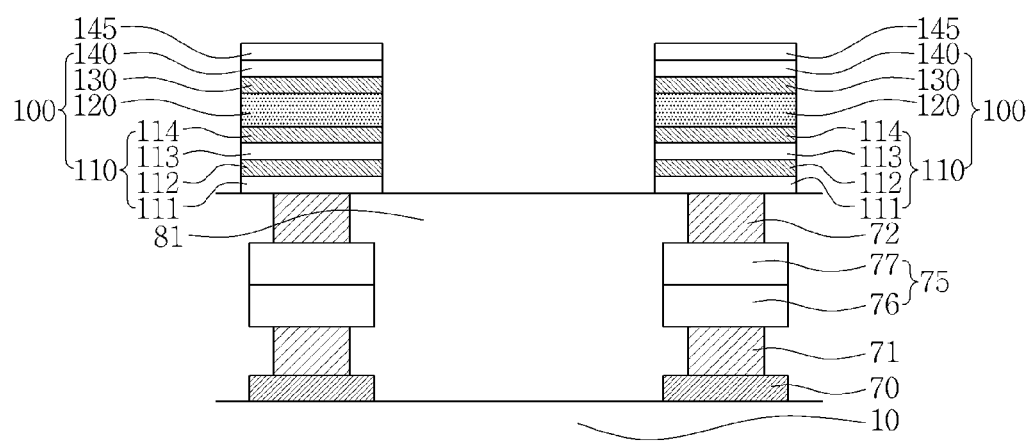

Referring to FIG. 5E, the method may include forming a magneto resistive cell 100 by performing processes such as those described with reference FIG. 4P. The hardmask 145 may remain on the capping layer 140. Accordingly, the magneto resistive cell 100 may include the ferromagnetic layer 110, the tunneling barrier layer 120, the free layer 130, the capping layer 140, and the hardmask 145. In another embodiment, the hardmask 145 may be completely removed.

Figure 5F:
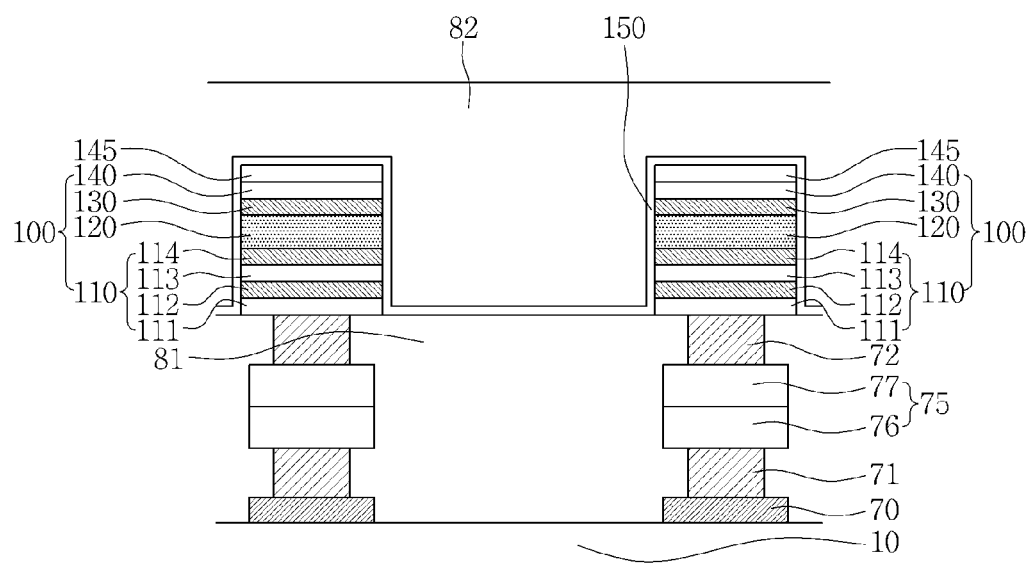

Referring to FIG. 5F, the method may include forming a liner layer 150 and a second interlayer insulating layer 82 by performing processes similar to those described with reference to FIG. 4Q.

Figure 5G:
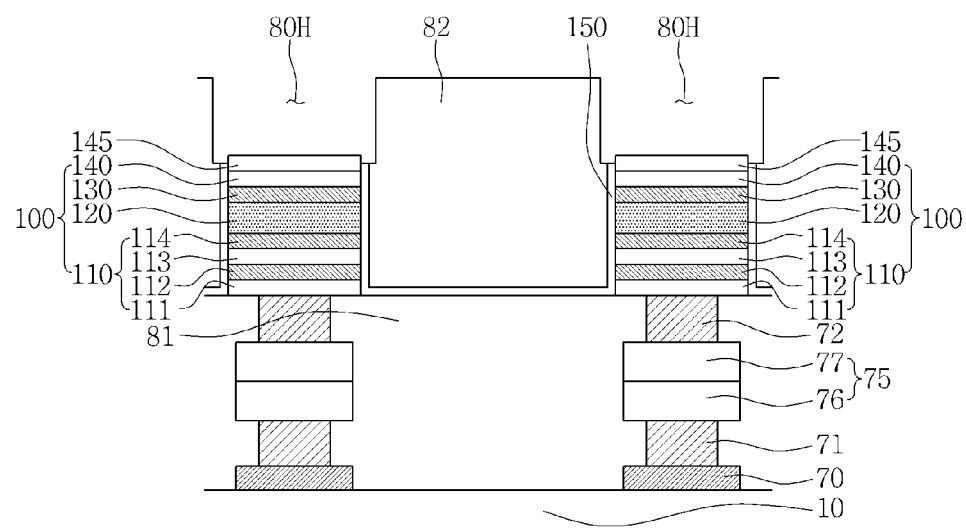

Referring to FIG. 5G, the method may include forming a via hole 80H vertically passing through the second interlayer insulating layer 82 and the liner layer 150 to expose the capping layer 140 of the magneto resistive cell 100. The via hole 80H may completely expose an upper surface of the hardmask 145 and may partially expose upper portions of sidewalls of the hardmask 145.

Figure 5H:
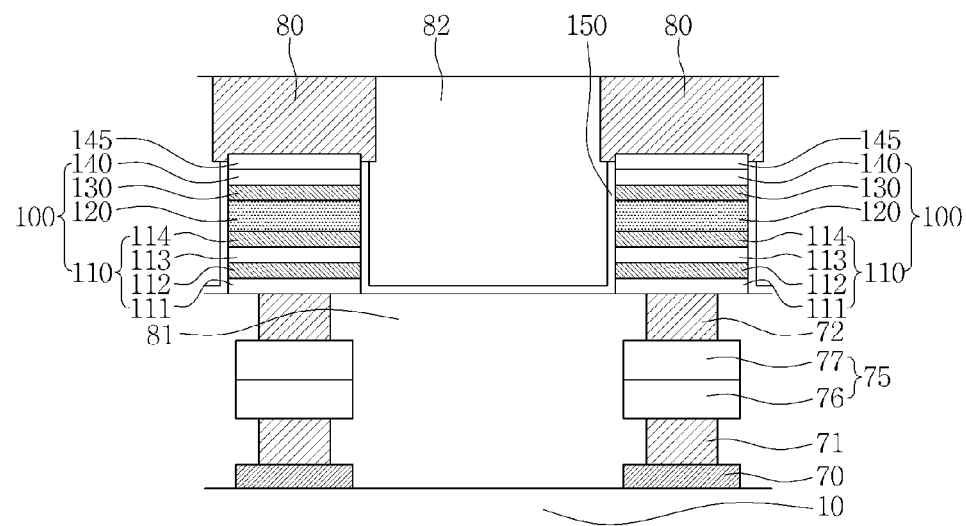

Referring to FIG. 5H, the method may include forming a via plug 80 filling the via hole 80H, such that the via plug 80 may be connected with the upper surface and the upper portions of the sidewalls of the hardmask 145.

Referring to FIG. 2B, the method may further include forming a bit line 65 on the via plug 80.

Figure 6:
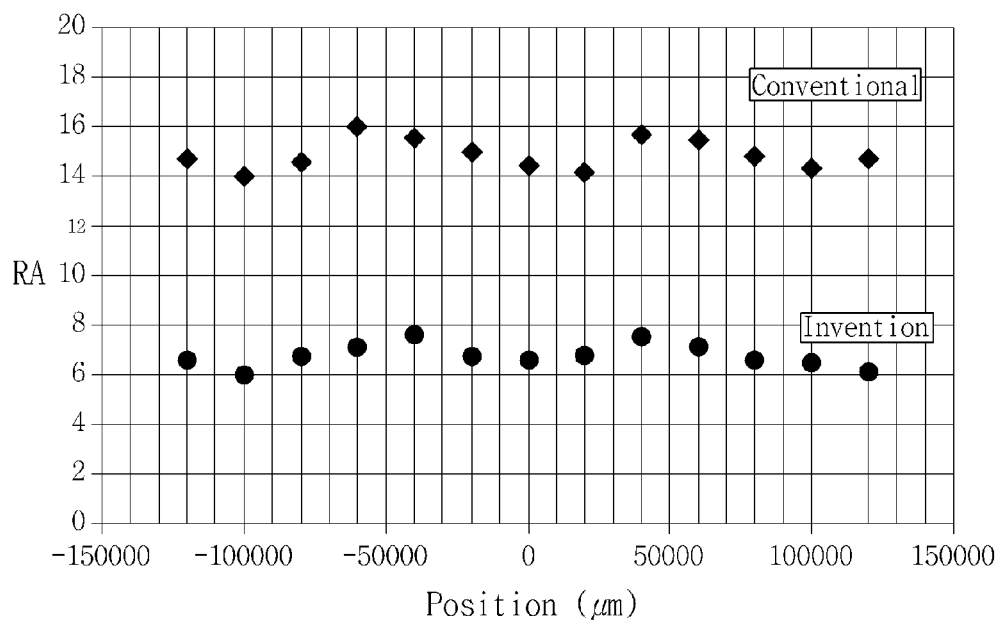
FIG. 6 is a graph comparing RA (i.e., resistance×area) values measured from magneto resistive cells fabricated using the inventive concepts with those of conventionally manufactured magneto resistive cells.

FIG. 6 is a graph comparing RA (i.e., resistance×area) values measured from magneto resistive cells fabricated using embodiments of the inventive concepts with those fabricated using conventional methods.

Referring to FIG. 6, magneto resistive cells fabricated using the methods of the inventive concepts may have significantly lower RA values compared to those fabricated using conventional methods.

FIG. 7 is a somewhat schematic diagram illustrating a processing apparatus 300 for fabricating a MRAM device in accordance with another embodiment of the inventive concepts.

Referring to FIG. 7, the processing apparatus 300 may include a load-lock chamber 310, a transfer chamber 320, a depositing chamber 330, a cooling chamber 340, and an oxidizing chamber 350.

The load-lock chamber 310 may include a load-lock stage 311 capable of mounting a substrate 10. The substrate 10 arranged on the load-lock stage 311 may be transferred to and/or from an inside of the transfer chamber 320. The load-lock chamber 310 may be vacuumed after receiving the substrate 10.

The transfer chamber 320 may include a transfer rail 321 and a transfer arm 325. The transfer arm 325 may move along the transfer rail 321 to transfer the substrate 10 to and/or from the load-lock chamber 310, the depositing chamber 330, the cooling chamber 340, and the oxidizing chamber 350.

The depositing chamber 330 may include a depositing stage 331 and targets 335. For example, the substrate 10 may be mounted on the depositing stage 331 of the depositing chamber 330, and then materials to be deposited may be deposited from the targets 335 onto the substrate 10 mounted on the depositing stage 331.

During a cooling process, the substrate 10 may be arranged on a cooling stage 341 in the cooling chamber 340 and may be cooled to a temperature within a range of approximately between about 50° K (−223° C.) to about 300° K (−27° C.). A liquid helium gas or a liquid nitrogen gas may be supplied into the cooling chamber 340 as a refrigerant.

A method of fabricating the magneto resistive cell 100 using the processing apparatus 300 may include loading the substrate 10 having the upper pinned layer 114 thereon onto the load-lock stage 311 of the load-lock chamber 310, transferring the substrate 10 from the load-lock chamber 310 onto the cooling stage 341 of the cooling chamber 340 using the transfer arm 325 of the transfer chamber 320, and then cooling the substrate 10 on the cooling stage 341 in the cooling chamber 340 to a temperature within a range of approximately between about 50° K (−223° C.) to about 300° K (−27° C.). After the cooling process has been performed, the cooled substrate 10 can be transferred from the cooling chamber 340 onto the depositing stage 331 in the depositing chamber 330 using the transfer arm 325. The cooled substrate 10 can be repetitively moved between the depositing stage 331 in the depositing chamber 330 and the oxidizing stage 351 in the oxidizing chamber 350 to form and then oxidize Mg layers 121 to 124. The Mg layers 121 to 124 can thereby be formed into MgO layers 121ox to 124ox to produce the tunneling barrier layer 120 on the cooled substrate 10.

For example, the method of forming of the tunneling barrier layer 120 may include transferring the cooled substrate 10 having the upper pinned layer 114 onto the depositing stage 331 in the depositing chamber 330 and forming the first Mg layer 121 on the upper pinned layer 114 through a first depositing process, transferring the substrate 10 having the first Mg layer 121 onto the oxidizing stage 351 in the oxidizing chamber 350 and oxidizing the first Mg layer 121 to form the first MgO layer 121$ox$ using a first oxidizing process, transferring the substrate 10 having the first MgO layer 121$ox$ onto the depositing stage 331 in the depositing chamber 330 and forming the second Mg layer 122 on the first MgO layer 121$ox$ by performing a second depositing process, transferring the substrate 10 having the second Mg layer 122 onto the oxidizing stage 351 in the oxidizing chamber 350 and oxidizing the second Mg layer 121 to form the second MgO layer 122$ox$ through a second oxidizing process, transferring the substrate 10 having the second MgO layer 122$ox$ onto the depositing stage 331 in the depositing chamber 330 and forming the third Mg layer 123 on the second MgO layer 122$ox$ through a third depositing process, transferring the substrate 10 having the third Mg layer 123 onto the oxidizing stage 351 in the oxidizing chamber 350, oxidizing the third Mg layer 123 to form the third MgO layer 123$ox$ through a third oxidizing process, transferring the substrate 10 having the third MgO layer 123$ox$ onto the depositing stage 331 in the depositing chamber 330 and forming the fourth Mg layer 124 on the third MgO layer 122$ox$ using a fourth depositing process, and transferring the substrate 10 having the fourth Mg layer 124 onto the oxidizing stage 351 in the oxidizing chamber 350 and oxidizing the fourth Mg layer 124 to form the fourth MgO layer 124$ox$ by performing a fourth oxidizing process. One or more additional cooling processes may be performed between any one or more of the layer formation processes. To do this, the substrate 10 having the MgO layer formed thereon may be transferred onto the cooling stage 341 in the cooling chamber 340, and a cooling process may be performed thereon, before transferring the substrate 10 back to the depositing stage 331 in the depositing chamber 330.

Figure 8A:
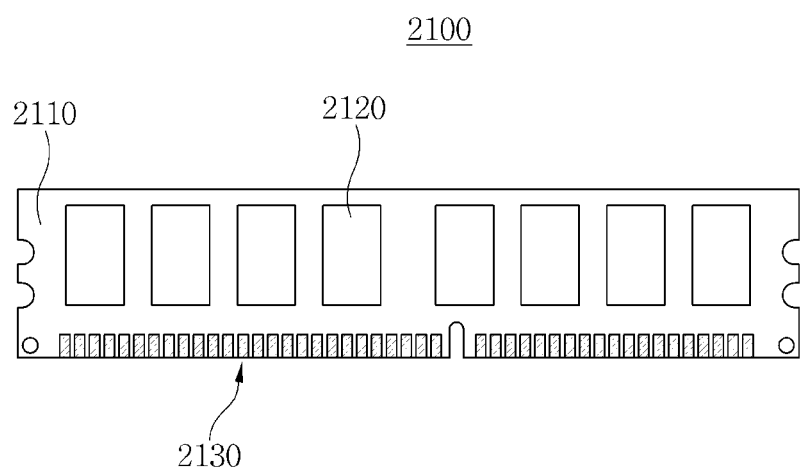
FIG. 8A is a schematic illustration of a memory module including one or more MRAM devices constructed in accordance with embodiments of the inventive concepts.

FIG. 8A is a diagram illustrating a memory module 2100 including one or more MRAM devices constructed in accordance with various embodiments of the inventive concepts. Referring to FIG. 8A, the memory module 2100 may include a module substrate 2110, a plurality of memory devices 2120 disposed on the module substrate 2110, and a plurality of terminals 2130 arranged on a side of the module substrate 2110. The module substrate 2110 may include a printed circuit board (PCB). The memory devices 2120 may include MRAM devices constructed in accordance with various embodiments of the inventive concepts. The plurality of terminals 2130 may include a metal such as copper. Each of the terminals 2130 may be electrically connected with each of the memory devices 2120.

Figure 8B:
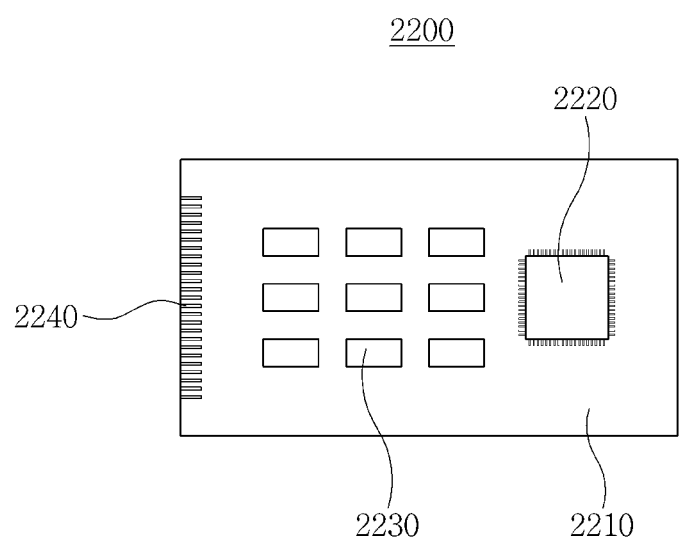
FIG. 8B is a schematic illustration of a semiconductor module in accordance with another embodiment of the inventive concepts.

FIG. 8B is a diagram illustrating a semiconductor module 2200 in accordance with another embodiment of the inventive concepts. Referring to FIG. 8B, the semiconductor module 2200 may include a processor 2220 mounted on a module substrate 2210, and semiconductor devices 2230. The processor 2220 and/or the semiconductor devices 2230 may include MRAM devices constructed in accordance with various embodiments of the inventive concepts. Conductive input/output terminals 2240 may be disposed on at least one side of the module substrate 2210.

Figure 8C:
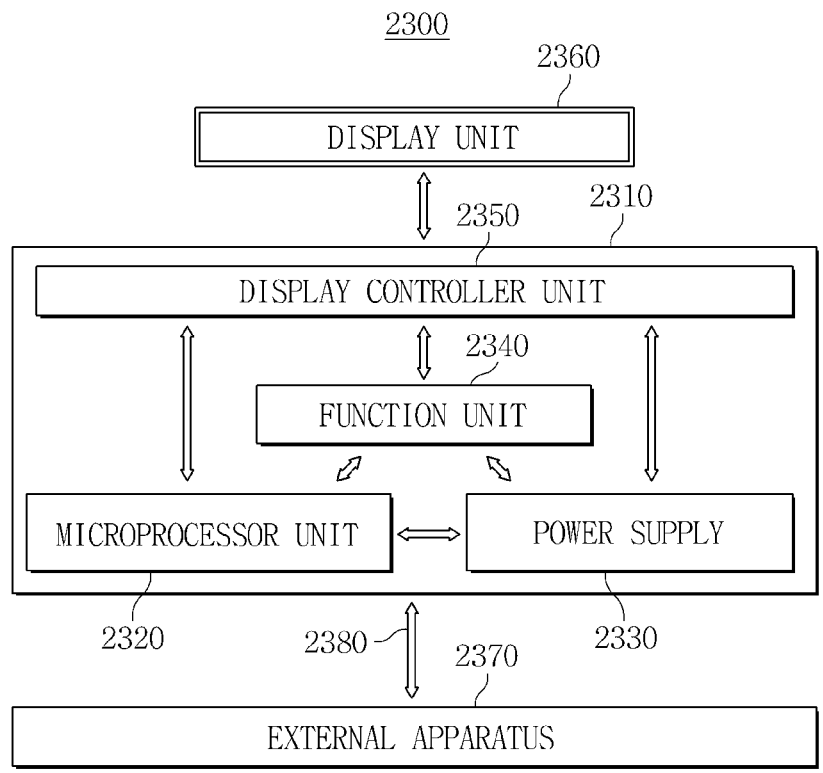
FIGS. 8C and 8D are block diagrams conceptually illustrating electronic systems constructed in accordance with still further embodiments of the inventive concepts.
Figure 8D:
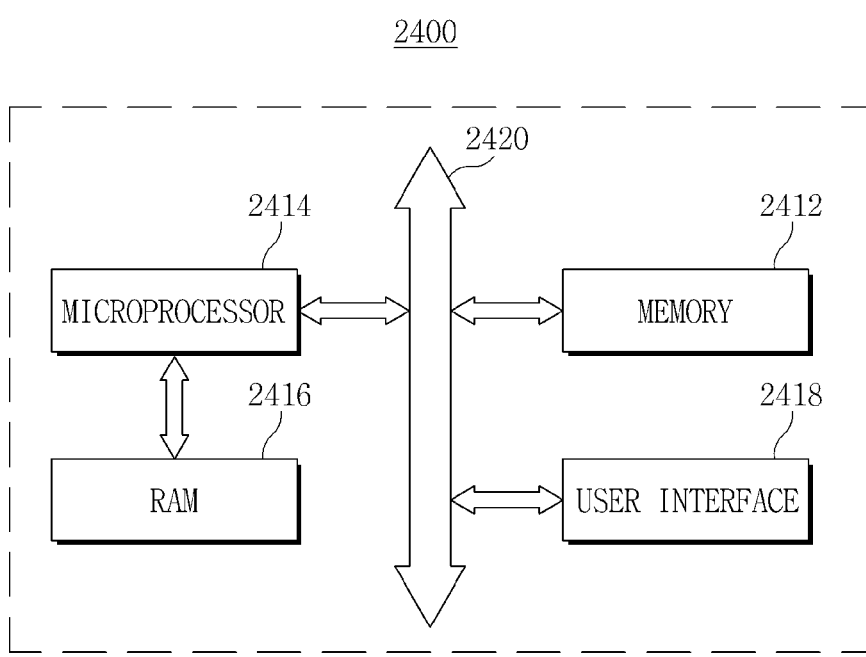

FIGS. 8C and 8D are block diagrams conceptually showing electronic systems 2300 and 2400 in accordance with further embodiments of the inventive concepts. Referring to FIG. 8C, the electronic system 2300 may include a body 2310, a display unit 2360, and an external apparatus 2370. The body 2310 may include a microprocessor unit 2320, a power supply 2330, a function unit 2340, and/or a display controller unit 2350. The body 2310 may include a system board or motherboard including a PCB and/or a case. The microprocessor unit 2320, the power supply 2330, the function unit 2340, and the display controller unit 2350 may be mounted or disposed on a top surface or an inside of the body 2310. The display unit 2360 may be disposed on the top surface of the body 2310 or an inside/outside of the body 2310. The display unit 2360 may display an image processed by the display controller unit 2350. For example, the display unit 2360 may include a liquid crystal display (LCD), an active matrix organic light emitting diode (AMOLED), or various display panels. The display unit 2360 may include a touch screen. Accordingly, the display unit 2360 may include an input/output function. The power supply 2330 may supply a current or voltage to the microprocessor unit 2320, the function unit 2340, the display controller unit 2350, etc. The power supply 2330 may include a rechargeable battery, a socket for the battery, or a voltage/current converter. The microprocessor unit 2320 may receive a voltage from the power supply 2330 to control the function unit 2340 and the display unit 2360. For example, the microprocessor unit 2320 may include a CPU or an application processor (AP). The function unit 2340 may include a touch-pad, a touch-screen, a volatile/nonvolatile memory, a memory card controller, a camera, a lighting, an audio and video playback processor, a wireless transmission/reception antenna, a speaker, a microphone, a USB port, and other units having various functions. The microprocessor unit 2320 and/or the function unit 2340 may include MRAM devices constructed in accordance with various embodiments of the inventive concepts.

Referring to FIG. 8D, the electronic system 2400 may include a microprocessor 2414, a memory 2412, and a user interface 2418 which performs data communication using a bus 2420. The microprocessor 2414 may include a CPU or an AP. The electronic system 2400 may further include a random access memory (RAM) 2416 which directly communicates with the microprocessor 2414. The microprocessor 2414 and/or the RAM 2416 may be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a lighting, or various other input/output devices. The memory 2412 may store codes for operating the microprocessor 2414, data processed by the microprocessor 2414, or external input data. The memory 2412 may include a memory controller, a hard disk, or a solid state drive (SSD). The microprocessor 2414, the RAM 2416, and/or the memory 2412 may include MRAM devices constructed in accordance with various embodiments of the inventive concepts.

MRAM devices having magneto resistive cells in embodiments of the inventive concepts may include a tunneling barrier layer having a low RA value, thereby enabling the magnetic resistive memory cell of the MRAM device to operate with low power consumption.

The processing apparatus according to the inventive concepts can be used to manufacture magneto resistive cells of MRAM devices including tunneling barrier layers having low RA values within a short process time, thereby improving productivity of the manufacturing process.

Although a few embodiments have been described, those skilled in the art will readily appreciate that many modifications are possible without materially departing from the novel teachings and advantages disclosed herein. Accordingly, all such modifications are intended to be included within the scope of the inventive concepts as defined in the claims.

What is claimed is:

1. A method of fabricating a magnetic resistive random access memory (MRAM) device, the method comprising:
   forming a lower electrode on a substrate;
   forming a seed layer on the lower electrode;
   forming a pinning layer including a CoPt-based layer or CoPd-based layer;
   forming a synthetic anti-ferromagnetic (SAF) layer on the pinning layer;
   forming a pinned layer including a CoFe-based layer; on the SAF layer;
   cooling the substrate having the pinned layer exposed thereon to a range of approximately between about 50° K to about 300° K;
   forming a first Mg layer on the pinned layer, after the cooling of the substrate having the pinned layer;
   forming a first MgO layer by oxidizing the first Mg layer;
   forming a second Mg layer on the first MgO layer;
   forming a second MgO layer by oxidizing the second Mg layer, wherein the first and second MgO layers collectively form an MgO structure;
   forming a free layer on the MgO structure;
   forming a capping layer on the free layer; and
   forming an upper electrode on the capping layer.

2. The method of claim 1,
   wherein the seed layer comprises at least one of Ta or Ru.

3. The method of claim 2,
   wherein the seed layer comprises a lower Ta layer and an upper Ru layer stacked on the lower Ta layer.

4. The method of claim 1,
   wherein the pinning layer having a hexagonal closest packing (HCP) structure.

5. The method of claim 1,
   wherein the pinning layer comprises a stacked layer of Co/Pt or Co/Pd having a face center cubic (FCC) structure or FCC-like structures.

6. The method of claim 1,
   wherein the SAF layer comprises Ru.

7. The method of claim 1,
   wherein the pinned layer comprises CoFeB.

8. The method of claim 7,
   wherein the pinned layer comprises one of multilayer structures including CoFeB/Ta/CoFeB, Co/B/CoFeB, or Co/W/CoFeB/W/CoFeB.

9. The method of claim 1,
   wherein the free layer comprises a single layer including CoFeB, or a multilayer including CoFeB/W/CoFeB.

10. The method of claim 1,
    wherein the capping layer comprises a metal including Ta.

11. The method of claim 1, further comprising:
    forming a third Mg layer between the second MgO layer and the free layer; and
    forming a third MgO layer by oxidizing the third Mg layer.

12. The method of claim 11,
    wherein the first MgO layer, the second MgO layer, and the third MgO layer are unified to be materially contiguous with each other.

13. The method of claim 11, further comprising:
    cooling the second MgO layer before forming the third Mg layer thereon.

14. The method of claim 1, further comprising:
    cooling the first MgO layer before forming the second Mg layer thereon.

15. A method of fabricating an MRAM device, the method comprising:
    forming a lower electrode on a substrate;
    forming a seed layer having Ta and Ru on a lower electrode;
    forming a pinning layer including a Co-based layer on the seed layer;
    forming an SAF layer on the pinning layer;
    forming a pinned layer including an CoFe-based layer on the SAF layer;
    cooling the substrate having the pinned layer exposed thereon to a range of approximately between about 50° K to about 300° K;
    forming a first Mg layer on the pinned layer, after the cooling of the substrate having the pinned layer;
    forming a first MgO layer by oxidizing the first MgO layer;
    forming a second Mg layer on the first MgO layer;
    forming a second MgO layer by oxidizing the second Mg layer;
    forming a free layer having CoFeB on the second MgO layer;
    forming a capping layer having Ta on the free layer; and
    forming an upper electrode on the capping layer.

* * * * *